US010566326B2

(12) United States Patent
Kwak et al.

(10) Patent No.: US 10,566,326 B2
(45) Date of Patent: Feb. 18, 2020

(54) SEMICONDUCTOR DEVICES INCLUDING A DEVICE ISOLATION REGION IN A SUBSTRATE AND/OR FIN

(71) Applicant: Samsung Electronics Co., Ltd., Suwon-si, Gyeonggi-do (KR)

(72) Inventors: Dae Young Kwak, Seongnam-si (KR); Ki Byung Park, Hwaseong-si (KR); Kyoung Hwan Yeo, Seoul (KR); Seung Jae Lee, Hwaseong-si (KR); Kyung Yub Jeon, Yongin-si (KR); Seung Seok Ha, Hwaseong-si (KR); Sang Jin Hyun, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 161 days.

(21) Appl. No.: 15/643,062

(22) Filed: Jul. 6, 2017

(65) Prior Publication Data
US 2018/0090493 A1 Mar. 29, 2018

(30) Foreign Application Priority Data
Sep. 27, 2016 (KR) .......................... 10-2016-0123976

(51) Int. Cl.
*H01L 27/088* (2006.01)
*H01L 21/8234* (2006.01)
*H01L 29/66* (2006.01)

(52) U.S. Cl.
CPC .. *H01L 27/0886* (2013.01); *H01L 21/823431* (2013.01); *H01L 21/823481* (2013.01); *H01L 29/6656* (2013.01)

(58) Field of Classification Search
CPC ............ H01L 27/0886; H01L 27/1211; H01L 29/6656; H01L 29/66795; H01L 29/785; H01L 21/823878; H01L 21/823481; H01L 21/76224; H01L 21/76227
See application file for complete search history.

(56) References Cited

U.S. PATENT DOCUMENTS

| 7,282,444 B2 | 10/2007 | Tanida et al. |
| 7,525,160 B2 | 4/2009 | Kavalieros et al. |
| 7,737,017 B2 | 6/2010 | Eun |
| 8,872,284 B2 | 10/2014 | Kelly et al. |
| 9,054,213 B2 | 6/2015 | Kelly et al. |
| 9,153,583 B2 | 10/2015 | Glass et al. |
| 9,240,484 B2 | 1/2016 | Kelly et al. |

(Continued)

FOREIGN PATENT DOCUMENTS

| JP | 2005-167093 A | 6/2005 |
| KR | 10-2003-0001874 A | 1/2003 |

(Continued)

*Primary Examiner* — Christine A Enad
(74) *Attorney, Agent, or Firm* — Myers Bigel, P.A.

(57) ABSTRACT

Semiconductor devices are provided. A semiconductor device includes a semiconductor substrate. The semiconductor device includes first and second source/drain regions in the semiconductor substrate. Moreover, the semiconductor device includes a multi-layer device isolation region in the semiconductor substrate between the first and second source/drain regions. The multi-layer device isolation region includes a protruding portion that protrudes away from the semiconductor substrate beyond respective uppermost surfaces of the first and second source/drain regions.

14 Claims, 31 Drawing Sheets

(56) References Cited

U.S. PATENT DOCUMENTS

| | | |
|---|---|---|
| 9,299,700 B2 | 3/2016 | Park et al. |
| 9,362,181 B1 | 6/2016 | Xie et al. |
| 2009/0004817 A1* | 1/2009 | Kim ................ H01L 21/76232 438/435 |
| 2009/0160031 A1* | 6/2009 | Kim ................ H01L 21/76232 257/622 |
| 2015/0021710 A1 | 1/2015 | Hsu et al. |
| 2015/0035061 A1 | 2/2015 | Yoon et al. |
| 2015/0137224 A1 | 5/2015 | Meiser et al. |
| 2015/0214341 A1* | 7/2015 | Shin ................ H01L 29/66818 257/401 |
| 2016/0043170 A1* | 2/2016 | Park ................ H01L 27/0886 257/369 |
| 2016/0111336 A1 | 4/2016 | Chang et al. |
| 2016/0111524 A1 | 4/2016 | Ha et al. |
| 2016/0268392 A1* | 9/2016 | Zhu ................ H01L 21/76224 |

FOREIGN PATENT DOCUMENTS

| | | |
|---|---|---|
| KR | 10-1003496 B1 | 12/2010 |
| KR | 10-1215775 B1 | 12/2012 |
| KR | 10-1320137 B1 | 10/2013 |
| WO | WO 2007-075309 A1 | 7/2005 |

* cited by examiner

SEMICONDUCTOR DEVICES INCLUDING A DEVICE ISOLATION REGION IN A SUBSTRATE AND/OR FIN

CROSS-REFERENCE TO RELATED APPLICATION

This application claims priority from Korean Patent Application No. 10-2016-0123976, filed on Sep. 27, 2016 in the Korean Intellectual Property Office, and claims all the benefits accruing therefrom under 35 U.S.C. 119, the content of which priority application is hereby incorporated by reference herein in its entirety.

BACKGROUND

The present disclosure relates to semiconductor devices and methods for fabricating the same. For semiconductor device density enhancement, a multigate transistor has been suggested as one scaling technology according to which a multi-channel active pattern (or silicon body) in a fin or nanowire shape is formed on a substrate, with gates then being formed on a surface of the multi-channel active pattern. A multigate transistor may allow easy scaling, as it uses a three-dimensional channel. Further, current control capability can be enhanced without requiring increased gate length of the multigate transistor. Furthermore, it may be possible to effectively suppress short channel effect (SCE), which is a phenomenon in which the electric potential of a channel region is influenced by the drain voltage.

SUMMARY

The present disclosure provides semiconductor devices that may have enhanced reliability and operating characteristics by reducing/preventing a short between source/drains of adjacent transistors. The present disclosure also provides methods for fabricating the semiconductor devices to enhance the reliability and the operating characteristics by reducing/preventing a short between source/drains of adjacent transistors.

The objects according to the present disclosure are not limited to those set forth above and objects other than those set forth above will be clearly understood to a person skilled in the art from the following description.

A semiconductor device, according to various embodiments herein, may include a fin-type pattern on a substrate. The semiconductor device may include a first gate structure on the fin-type pattern, the first gate structure including a first gate spacer. The semiconductor device may include a second gate structure on the fin-type pattern, the second gate structure being spaced apart from the first gate structure and including a second gate spacer. The semiconductor device may include a pair of dummy spacers spaced apart from each other between the first gate spacer and the second gate spacer. A height from an upper surface of the fin-type pattern to an upper surface of the pair of dummy spacers may be less than a height from the upper surface of the fin-type pattern to an upper surface of the first and second gate spacers. The semiconductor device may include a trench between the pair of dummy spacers. The trench may include a sidewall defined by the fin-type pattern and one of the pair of dummy spacers. Moreover, the semiconductor device may include a device isolating film in the trench, and including a first insulating film and a second insulating film on the first insulating film. The first insulating film may extend along the sidewall and a bottom surface of the trench, and a thickness of the first insulating film on the bottom surface of the trench may be greater than a thickness of the first insulating film on the sidewall of the trench.

A semiconductor device, according to various embodiments, may include a fin-type pattern on a substrate. The semiconductor device may include a first gate structure on the fin-type pattern. The first gate structure may include a first gate spacer. The semiconductor device may include a second gate structure on the fin-type pattern. The second gate structure may be spaced apart from the first gate structure and including a second gate spacer. The semiconductor device may include a pair of dummy spacers spaced apart from each other between the first gate spacer and the second gate spacer. The semiconductor device may include a trench between the pair of dummy spacers, and may include a sidewall defined by the fin-type pattern and the pair of dummy spacers. Moreover, the semiconductor device may include a device isolating film including a first insulating film in a portion of the trench, and a second insulating film covering an uppermost surface of the first insulating film.

A semiconductor device, according to various embodiments, may include a substrate including a first region and a second region. The semiconductor device may include a first fin-type pattern in the first region. The semiconductor device may include a first gate structure including a first gate spacer, on the first fin-type pattern. The semiconductor device may include a second gate structure spaced apart from the first gate structure and including a second gate spacer, on the first fin-type pattern. The semiconductor device may include a pair of first dummy spacers spaced apart from each other between the first gate spacer and the second gate spacer. The semiconductor device may include a first trench between the pair of first dummy spacers, including a sidewall defined by the first fin-type pattern and the pair of first dummy spacers. The semiconductor device may include a first device isolating film in the first trench, and including a first insulating film, and a second insulating film on the first insulating film. The first insulating film may have a different material from the second insulating film. The semiconductor device may include a second fin-type pattern in the second region. The semiconductor device may include a third gate structure including a third gate spacer, on the second fin-type pattern. The semiconductor device may include a fourth gate structure spaced apart from the third gate structure and including a fourth gate spacer, on the second fin-type pattern. The semiconductor device may include a pair of second dummy spacers spaced apart from each other between the third gate spacer and the fourth gate spacer. The semiconductor device may include a second trench between the pair of second dummy spacers, including a sidewall defined by the second fin-type pattern and the pair of second dummy spacers. Moreover, the semiconductor device may include a second device isolating film in the second trench, and including the same material as the first insulating film.

A semiconductor device, according to various embodiments, may include a semiconductor substrate. The semiconductor device may include first and second source/drain regions in the semiconductor substrate. The first and second source/drain regions may be first and second source/drain regions of respective first and second transistors. Moreover, the semiconductor device may include a multi-layer device isolation region in the semiconductor substrate between the first and second source/drain regions. The multi-layer device isolation region may include a protruding portion that protrudes away from the semiconductor substrate beyond respective uppermost surfaces of the first and second source/drain regions.

BRIEF DESCRIPTION OF THE DRAWINGS

The above and other objects, features and advantages of the present disclosure will become more apparent to those of ordinary skill in the art by describing in detail example embodiments thereof with reference to the accompanying drawings, in which.

DETAILED DESCRIPTION

Although drawings regarding a semiconductor device according to some example embodiments herein provide examples of a fin-type transistor (FinFET) including a channel region in a fin-type pattern shape, example embodiments are not limited thereto. It is possible that a semiconductor device according to some example embodiments may include a tunneling transistor (tunneling FET), a transistor including nanowire, a transistor including nano-sheet, or a three-dimensional (3D) transistor. Further, a semiconductor device according to some example embodiments may include a bipolar junction transistor, a laterally diffused metal oxide semiconductor (LDMOS) transistor, and so on.

Figure 1:
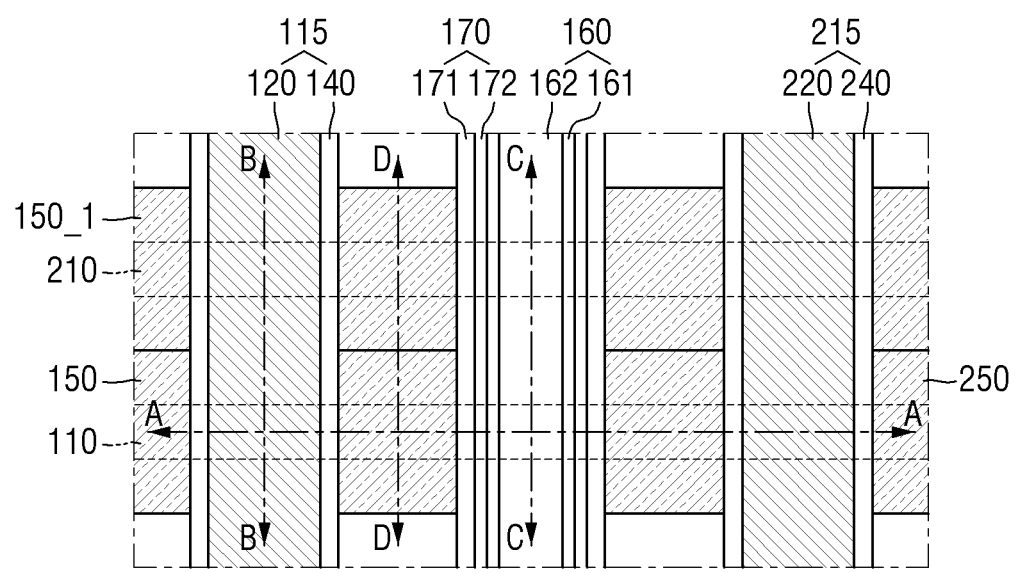
FIG. 1 is a schematic top view provided to explain a semiconductor device according to some example embodiments.
Figure 2:
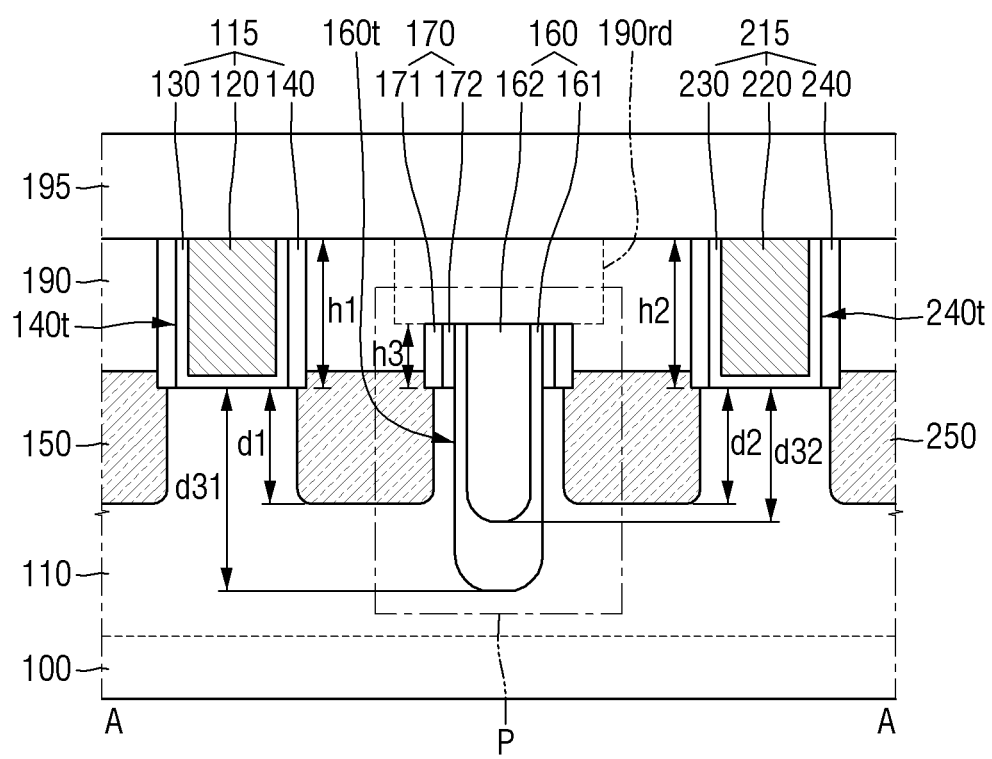
FIG. 2 is a cross sectional view taken along line A-A of FIG. 1.
Figure 3A:
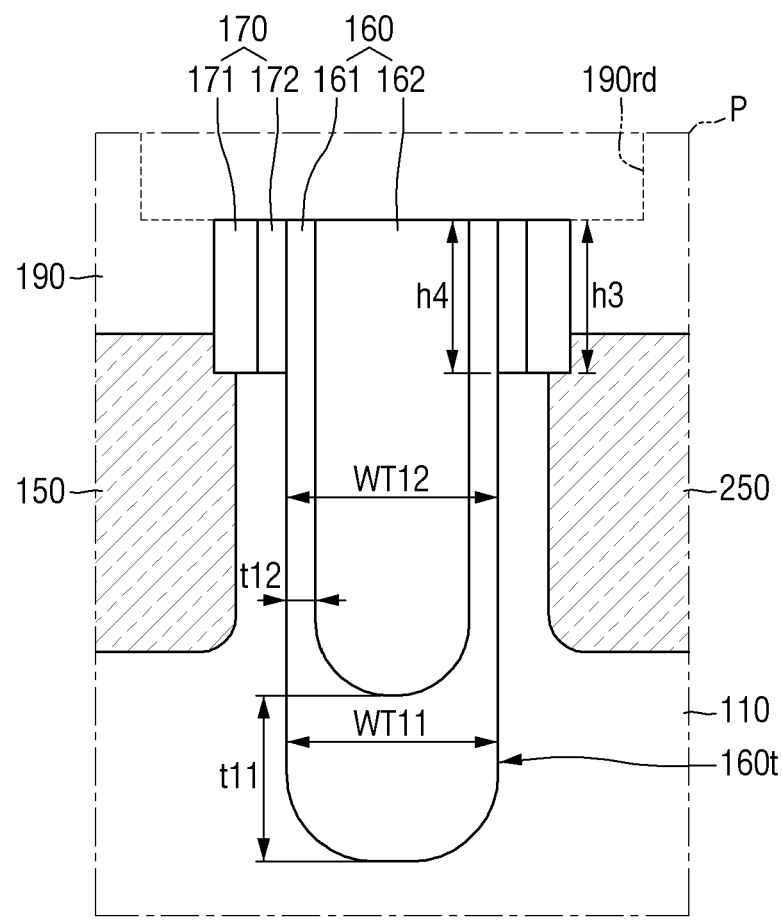
FIGS. 3A and 3B are enlarged views of a section P of FIG. 2.
Figure 3B:
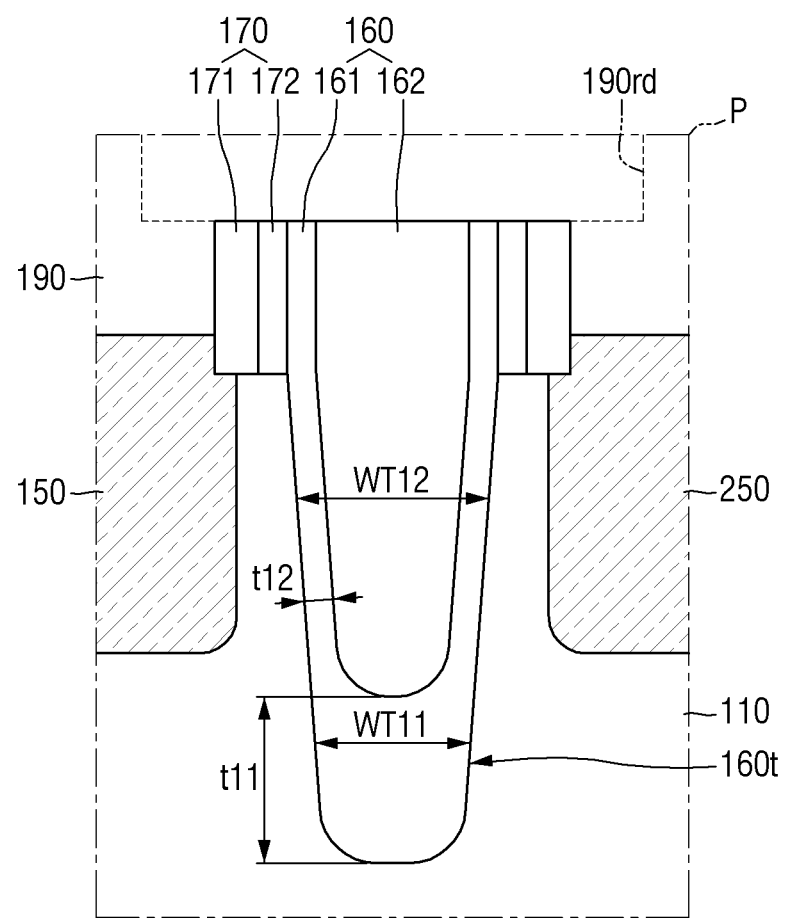
Figure 4:
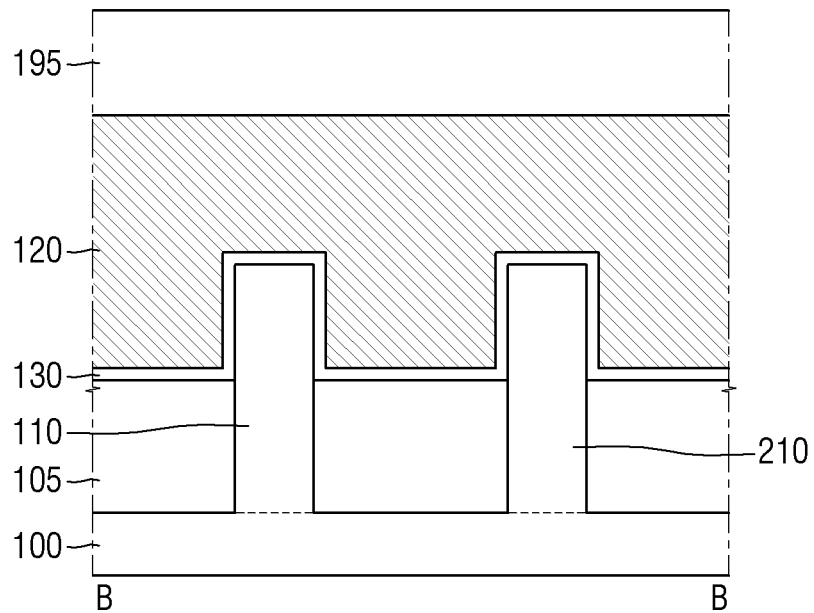
FIG. 4 is a cross sectional view taken along line B-B of FIG. 1.
Figure 5:
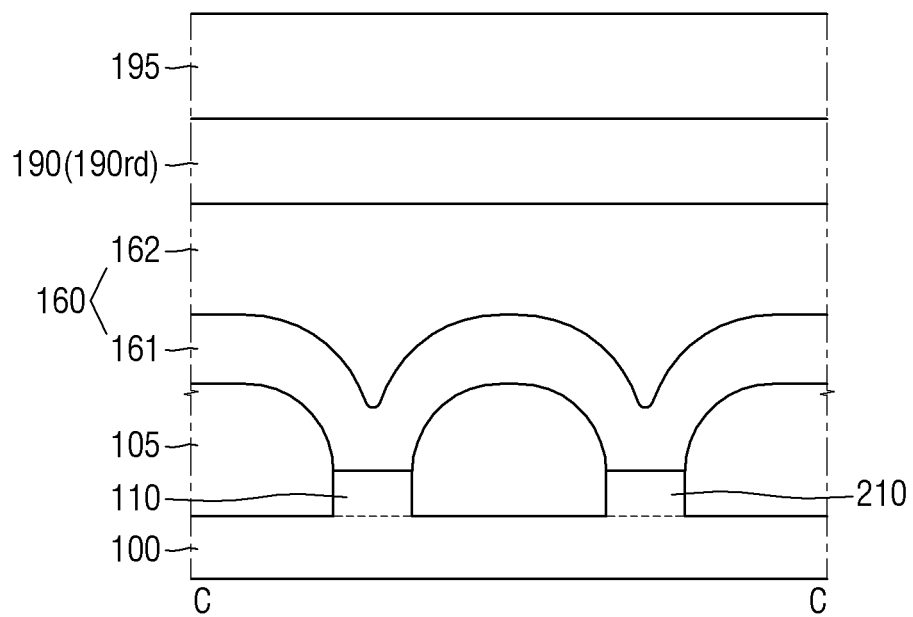
FIG. 5 is a cross sectional view taken along line C-C of FIG. 1.
Figure 6:
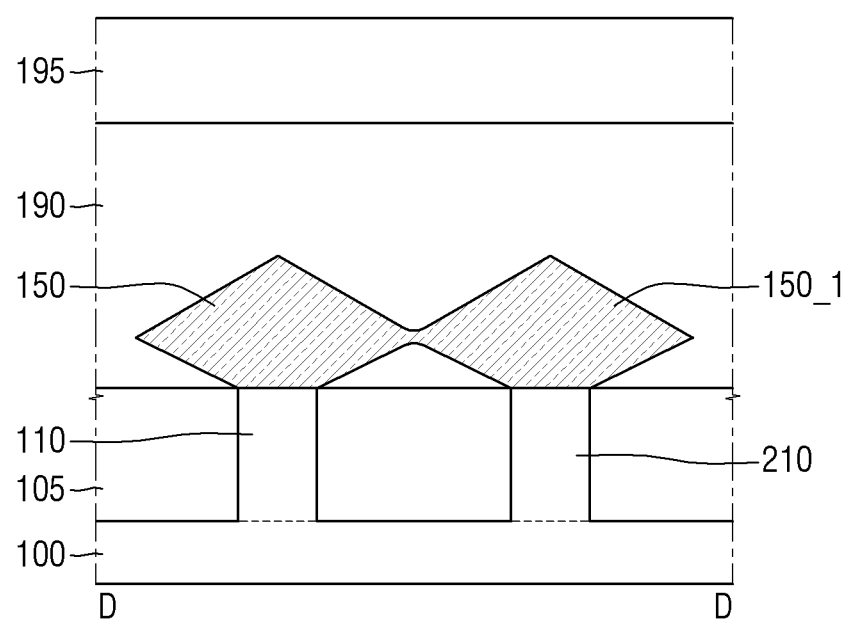
FIG. 6 is a cross sectional view taken along line D-D of FIG. 1.

FIG. 1 is a schematic top view provided to explain a semiconductor device according to some example embodiments of the present disclosure. FIG. 2 is a cross sectional view taken along line A-A of FIG. 1. FIGS. 3A and 3B are enlarged views of a section P of FIG. 2. FIG. 4 is a cross sectional view taken along line B-B of FIG. 1. FIG. 5 is a cross sectional view taken along line C-C of FIG. 1. FIG. 6 is a cross sectional view taken along line D-D of FIG. 1.

For reference, FIG. 1 excludes illustration of first and second interlayer insulating films 190 and 195 (FIG. 2), and first and second gate insulating films 130 and 230 (FIG. 2) for convenience of explanation.

Referring to FIGS. 1 to 6, a semiconductor device according to some example embodiments may include a first fin-type pattern 110, a second fin-type pattern 210, a first gate structure 115, a second gate structure 215, a first device isolating film 160, a first dummy spacer(s) 170, a first epitaxial pattern 150, 150_1, and a second epitaxial pattern 250. The first fin-type pattern 110 or the second fin-type pattern 210 may be referred to herein as a "semiconductor fin."

A substrate 100 (FIG. 2) may be a bulk silicon or a silicon-on-insulator (SOI). Alternatively, the substrate 100 may be a silicon substrate, or may include other material such as silicon germanium, silicon germanium on insulator (SGOI), indium antimonide, lead telluride, indium arsenide, indium phosphide, gallium arsenide, or gallium antimonide, but not limited thereto. The substrate 100 and/or the first fin-type pattern 110, or the second fin-type pattern 210, may be referred to herein as a "semiconductor substrate." Moreover, the first device isolating film 160 may be referred to herein as a "device isolation region" that is in the semiconductor substrate.

The first fin-type pattern 110 and the second fin-type pattern 210 may extend longitudinally on the substrate 100 and in a first direction X1. The first fin-type pattern 110 and the second fin-type pattern 210 may protrude from the substrate 100.

The first fin-type pattern 110 and the second fin-type pattern 210 may be formed adjacent and parallel to each other. The first fin-type pattern 110 and the second fin-type pattern 210 may be arranged in a second direction Y1. More specifically, the first fin-type pattern 110 and the second fin-type pattern 210 may each include a long side extending in the first direction X1, and a short side extending in the second direction Y1. The long side of the first fin-type pattern 110 and the long side of the second fin-type pattern 210 may face each other.

The first fin-type pattern 110 and the second fin-type pattern 210 may be parts/portions of the substrate 100, and may include an epitaxial layer grown from the substrate 100.

The first fin-type pattern 110 and the second fin-type pattern 210 may include an elemental semiconductor material such as silicon or germanium. Alternatively, the first fin-type pattern 110 and the second fin-type pattern 210 may include a compound semiconductor such as a group IV-IV compound semiconductor or group III-V compound semiconductor. Specifically, taking the group IV-IV compound semiconductor as an example, the first fin-type pattern 110 and the second fin-type pattern 210 may be a binary compound or a ternary compound including at least two or more of carbon (C), silicon (Si), germanium (Ge) and tin (Sn), or these compounds doped with a group IV element. Taking the group III-V compound semiconductor as an example, the first fin-type pattern 110 and the second fin-type pattern 210 may be one of a binary compound, a ternary compound or a quaternary compound which is formed by a combination of a group III element, which may be at least one of aluminum (Al), gallium (Ga), or indium (In), and a group V element, which may be one of phosphorus (P), arsenic (As) and antimony (Sb).

In a semiconductor device according to some example embodiments, it is assumed that the first fin-type pattern 110 and the second fin-type pattern 210 are silicon fin-type patterns including silicon.

Regarding the semiconductor device explained with reference to FIGS. 1 to 6, the first fin-type pattern 110 and the second fin-type pattern 210 may include the channel regions of the same type of transistors.

A field insulating film 105 (FIG. 4) may be formed on the substrate 100. The field insulating film 105 may be formed between the first fin-type pattern 110 and the second fin-type pattern 210.

The field insulating film 105 may partially cover the first fin-type pattern 110 and the second fin-type pattern 210. For example, the field insulating film 105 may partially cover a sidewall of the first fin-type pattern 110 and a sidewall of the second fin-type pattern 210.

An upper surface of the first fin-type pattern 110 and an upper surface of the second fin-type pattern 210 may protrude upward higher than an upper surface of the field insulating film 105 formed between the long side of the first fin-type pattern 110 and the long side of the second fin-type pattern 210. The first fin-type pattern 110 and the second fin-type pattern 210 may be defined by the field insulating film 105 on the substrate 100.

For example, the field insulating film 105 may include at least one of silicon oxide film, silicon nitride film, or silicon oxynitride film.

Further, the field insulating film 105 may additionally include at least one field liner film formed between the first fin-type pattern 110 and the field insulating film 105 and between the second fin-type pattern 210 and the field insulating film 105. When the field insulating film 105 further includes the field liner film, the field liner film may include at least one of polysilicon, amorphous silicon, silicon oxynitride, silicon nitride, or silicon oxide.

The first gate structure 115 and the second gate structure 215 may each extend in the second direction Y1. Each of the first gate structure 115 and the second gate structure 215 may be formed on both the first fin-type pattern 110 and the second fin-type pattern 210 to intersect the first fin-type pattern 110 and the second fin-type pattern 210. The first gate structure 115 and the second gate structure 215 may be disposed apart from each other in the first direction X1.

The first gate structure 115 may include a first gate electrode 120, a first gate insulating film 130, a first gate spacer 140, and a first gate trench 140t defined by the first gate spacer 140.

The second gate structure 215 may include a second gate electrode 220, a second gate insulating film 230, a second gate spacer 240, and a second gate trench 240t defined by the second gate spacer 240.

The first gate electrode 120 and the second gate electrode 220 may each be formed on the first fin-type pattern 110, the field insulating film 105, and the second fin-type pattern 210. The first gate electrode 120 and the second gate electrode 220 may each surround the first fin-type pattern 110 and the second fin-type pattern 210 which are protruding upward higher than the upper surface of the field insulating film 105.

The first gate electrode 120 and the second gate electrode 220 may each include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or a combination thereof.

For example, the first gate electrode 120 and the second gate electrode 220 may be formed by the replacement process (or gate last process), but is not limited thereto.

The first gate spacer 140 may be formed on a sidewall of the first gate electrode 120. A second gate spacer 240 may be formed on a sidewall of the second gate electrode 220. The first gate spacer 140 and the second gate spacer 240 may each include at least one of, for example, silicon nitride (SiN), silicon oxynitride (SiON), silicon oxide (SiO$_2$), silicon oxycarbonitride (SiOCN), and a combination thereof.

The first gate insulating film 130 may be formed between the first fin-type pattern 110 and the first gate electrode 120, and between the second fin-type pattern 210 and the first gate electrode 120. The first gate insulating film 130 may be formed along a profile of the first fin-type pattern 110 and a profile of the second fin-type pattern 210 which are protruding upward higher than the field insulating film 105.

The first gate insulating film 130 may be formed along a sidewall and a bottom surface of the first gate trench 140t. The first gate insulating film 130 may be formed between the first gate spacer 140 and the first gate electrode 120.

The second gate insulating film 230 may be formed between the first fin-type pattern 110 and the second gate electrode 220, and between the second fin-type pattern 210 and the second gate electrode 220. The second gate insulating film 230 may be formed along the profile of the first fin-type pattern 110 and the profile of the second fin-type pattern 210 which are protruding upward higher than the field insulating film 105.

The second gate insulating film 230 may be formed along a sidewall and a bottom surface of the second gate trench 240t. The second gate insulating film 230 may be formed between the second gate spacer 240 and the second gate electrode 220.

Unlike the illustration in FIG. 4, an interfacial layer may be additionally formed between the first gate insulating film 130 and the first fin-type pattern 110, and between the first gate insulating film 130 and the second fin-type pattern 210. When the first fin-type pattern 110 and the second fin-type pattern 210 are silicon fin-type patterns, the interfacial layer may include a silicon oxide, for example. That is, the interfacial layer may vary depending on a material included in the first fin-type pattern 110 and the second fin-type pattern 210.

The first gate insulating film 130 and the second gate insulating film 230 may include a high-k dielectric material having a higher dielectric constant than a silicon oxide film. For example, the first gate insulating film 130 and the second gate insulating film 230 may include one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

A first epitaxial pattern 150 may be formed on opposite sides of the first gate structure 115. A second epitaxial pattern 250 may be formed on opposite sides of the second gate structure 215. The first epitaxial pattern 150 and the second epitaxial pattern 250 may be formed on the first fin-type pattern 110. The first epitaxial pattern 150 and the second epitaxial pattern 250 are adjacent to each other and are spaced apart from each other.

Each of the first epitaxial pattern 150 and the second epitaxial pattern 250 may be included within the source/drain of a transistor which uses the first fin-type pattern 110 as a channel region. The first epitaxial pattern 150 and the second epitaxial pattern 250 may each be a semiconductor pattern. The first epitaxial pattern 150 and the second epitaxial pattern 250 may be referred to herein as first and second "epitaxial regions," respectively.

When the first fin-type pattern 110 includes the channel region of PMOS transistor, the first epitaxial pattern 150 and the second epitaxial pattern 250 may include compressive stress materials. For example, the compressive stress material may be a material such as SiGe, which has a greater lattice constant than Si. For example, the compressive stress material can enhance carrier mobility in the channel region by exerting compressive stress on the first fin-type pattern 110.

On the other hand, when the first fin-type pattern 110 includes the channel region of NMOS transistor, the first epitaxial pattern 150 and the second epitaxial pattern 250 may include tensile stress materials. For example, when the first fin-type pattern 110 is Si, the first epitaxial pattern 150 and the second epitaxial pattern 250 may be a material such as SiC, which has a smaller lattice constant than Si. For example, the tensile stress material can enhance carrier mobility in the channel region by exerting tensile stress on the first fin-type pattern 110. Alternatively, when the first fin-type pattern 110 is Si, the first epitaxial pattern 150 and the second epitaxial pattern 250 may each be a silicon epitaxial pattern.

Referring to FIG. 6, the first epitaxial pattern 150 formed on the first fin-type pattern 110 and the first epitaxial pattern 150_1 formed on the second fin-type pattern 210 are illustrated as being in contact with each other, but example embodiments are not limited thereto.

Further, although it is illustrated that a height of the sidewall of first fin-type pattern 110 surrounded by the field insulating film 105 is the same as a distance from the substrate 100 to the interface between the first fin-type pattern 110 and the first epitaxial pattern 150, this is for convenience sake, and thus without limitation thereto.

A pair of first dummy spacers 170 may be disposed between the first gate spacer 140 and the second gate spacer 240 which are facing each other. The first dummy spacer(s) 170 may be disposed on the first fin-type pattern 110 and the second fin-type pattern 210, and intersect with the first fin-type pattern 110 and the second fin-type pattern 210.

For example, the first epitaxial pattern 150 may be formed between the first gate spacer 140 and the first dummy spacer(s) 170, and the second epitaxial pattern 250 be formed between the second gate spacer 240 and the first dummy spacer(s) 170.

Each of the pair of first dummy spacers 170 may include a first inner spacer 172 and a first outer spacer 171. The first outer spacer 171 may be located between the first inner spacer 172 and the first gate spacer 140, and between the first inner spacer 172 and the second gate spacer 240.

The first outer spacer 171 may include the same materials as the first gate spacer 140 and the second gate spacer 240. When the first gate spacer 140 and the second gate spacer 240 have a multi-film structure, the first outer spacer 171 may also have the same multi-film structure as the first gate spacer 140. The first inner spacer 172 may include, for example, silicon oxide.

Because a width of the first outer spacer 171 in the first direction X1 may be substantially same as a width of the first gate spacer 140 in the first direction X1, a width of the first dummy spacer(s) 170 in the first direction X1 may be greater than the width of the first gate spacer 140 in the first direction X1.

In a semiconductor device according to some example embodiments, a height h3 (FIG. 2) from the upper surface of the first fin-type pattern 110 to an upper surface of the first dummy spacer(s) 170 is less than a height h1 from the upper surface of the first fin-type pattern 110 to an upper surface of the first gate spacer 140 and a height h2 from the upper surface of the first fin-type pattern 110 to an upper surface of the second gate spacer 240.

A first isolating trench 160*t* may be formed between the first dummy spacers 170. The first isolating trench 160*t* may include a sidewall defined by the first fin-type pattern 110 and the first dummy spacers 170. More specifically, a sidewall of the first isolating trench 160*t* may be defined by the first fin-type pattern 110 and the first inner spacer 172.

The first inner spacer 172 may reduce/prevent damage on adjacent area such as the first epitaxial pattern 150 and the second epitaxial pattern 250 during forming of the first isolating trench 160*t* to form the first device isolating film 160. Accordingly, the semiconductor device can have enhanced reliability.

Referring to FIGS. 3A and 3B, the first isolating trench 160*t* may have a bottom surface with a rounded shape. In FIG. 3A, a width of the first isolating trench 160*t* in the first fin-type pattern 110 may be constant. For example, a width WT12 of the first isolating trench at a location spaced apart from the upper surface of the first fin-type pattern 110 by a first distance may be substantially same as a width WT11 of the first isolating trench at a location spaced apart from the upper surface of the first fin-type pattern 110 by a second distance that is greater than the first distance. Meanwhile, in FIG. 3B, a width of the first isolating trench 160*t* in the first fin-type pattern 110 may increase as it is farther away from the substrate 100. For example, the width WT12 of the first isolating trench at the location spaced apart from the upper surface of the first fin-type pattern 110 by the first distance may be greater than the width WT11 of the first isolating trench at the location spaced apart from the upper surface of the first fin-type pattern 110 by the second distance that is greater than the first distance.

The first device isolating film 160 may be formed in the first isolating trench 160*t*. The first device isolating film 160 may fill the first isolating trench 160*t*. The first device isolating film 160 may include a first lower insulating film 161 and a first upper insulating film 162. Because the first device isolating film 160 may include both the first lower insulating film 161 and the first upper insulating film 162, the first device isolating film 160 may be referred to herein as a "multi-layer device isolation region." Moreover, the first lower insulating film 161 and the first upper insulating film 162 may be referred to herein as lower and upper "insulating materials," respectively.

The first device isolating film 160 may be spaced apart from the first epitaxial pattern 150 and the second epitaxial pattern 250. That is, a portion of the first fin-type pattern 110 may be interposed between the first device isolating film 160 and the first epitaxial pattern 150, and between the first device isolating film 160 and the second epitaxial pattern 250. The first inner spacer 172 may be formed between the first device isolating film 160 and the first outer spacer 171.

The first lower insulating film 161 may extend along a sidewall and a bottom surface of the first isolating trench 160t. In a semiconductor device according to some example embodiments, a thickness t11 of the first lower insulating film 161 formed in the bottom surface of the first isolating trench 160t is greater than a thickness t12 of the first lower insulating film 161 formed on the sidewall of the first isolating trench 160t. That is, the first lower insulating film 161 may not be formed conformally along a sidewall and a bottom surface of the first trench 160t. The first upper insulating film 162 may be formed on the first lower insulating film 161. The first upper insulating film 162 may fill the rest (i.e., the remaining portion) of the first isolating trench 160t remaining after the first lower insulating film 161 is formed.

The first lower insulating film 161 may include a different insulating material from the first upper insulating film 162. In a semiconductor device according to some example embodiments, Young's Modulus of the first upper insulating film 162 may be less than that of the first lower insulating film 161. The first lower insulating film 161 may include silicon nitride (SiN), for example. The first upper insulating film 162 may include, for example, at least one of silicon oxide, silicon carbide (SiC), silicon oxycarbide (SiOC), silicon oxynitride (SiON), and silicon oxycarbon nitride (SiOCN).

The amount of the stress exerted onto the transistor adjacent to the first device isolating film 160 may be adjusted by using a material having a smaller Young's Modulus than the first lower insulating film 161 as the first upper insulating film 162. As a result, reducing deviation of driving voltage of the transistor having the same function can enhance reliability and performance of the semiconductor device.

A depth d31 (FIG. 2) from the upper surface of the first fin-type pattern 110 to the lowermost portion of the first device isolating film 160 is greater than a depth d1 (FIG. 2) from the upper surface of the first fin-type pattern 110 to the lower surface of the first epitaxial pattern 150. Further, the depth d31 from the upper surface of the first fin-type pattern 110 to a lowermost portion of the first device isolating film 160 is greater than a depth d2 (FIG. 2) from the upper surface of the first fin-type pattern 110 to a lower surface of the second epitaxial pattern 250.

In a semiconductor device according to some example embodiments, a depth d32 (FIG. 2) from the upper surface of the first fin-type pattern 110 to a lowermost portion of the first upper insulating film 162 is greater than the depth d1 from the upper surface of the first fin-type pattern 110 to the lower surface of the first epitaxial pattern 150. Further, the depth d32 from the upper surface of the first fin-type pattern 110 to the lowermost portion of the first upper insulating film 162 is greater than the depth d2 from the upper surface of the first fin-type pattern 110 to the lower surface of the second epitaxial pattern 250.

Further, for example, a height h4 (FIG. 3A) from the upper surface of the first fin-type pattern 110 to an upper surface of the first upper insulating film 162 may be substantially same as the height h3 from the upper surface of the first fin-type pattern 110 to the upper surface of the first dummy spacer(s) 170. That is, the first upper insulating film 162 may not entirely cover the upper surface of the first dummy spacer(s) 170.

As illustrated in FIG. 5, the first lower insulating film 161 may be formed along a profile of an upper surface of the field insulating film 105, and the first upper insulating film 162 may be formed on the first lower insulating film 161. In the formation of the first isolating trench 160t, the upper surface of the field insulating film 105 may be partially etched. As a result, the upper surface of the first fin-type pattern 110 may include a rounded shape, but is not limited thereto.

A lower interlayer insulating film 190 may be formed on the first epitaxial pattern 150, the second epitaxial pattern 250, the first device isolating film 160, and the first dummy spacer(s) 170. The lower interlayer insulating film 190 may surround a sidewall of the first gate structure 115 and a sidewall of the second gate structure 215. In the semiconductor device according to some example embodiments, the upper surface of the first gate electrode 120 and the second gate electrode 220 may be coplanar with an upper surface of the lower interlayer insulating film 190.

The lower interlayer insulating film 190 may include a redeposited insulating film 190rd. The redeposited insulating film 190rd may be a region deposited after formation of the first device isolating film 160. The redeposited insulating film 190rd may be formed on the first device isolating film 160 and the first dummy spacer(s) 170.

In the semiconductor device according to some example embodiments, an uppermost surface of the first lower insulating film 161 and an uppermost surface of the first upper insulating film 162 may be in contact with the lower interlayer insulating film 190. That is, the uppermost surface of the first lower insulating film 161 and the uppermost surface of the first upper insulating film 162 may be in contact with the redeposited insulating film 190rd of the lower interlayer insulating film 190. The words "in contact with," as used herein, refer to, for example, another film not being interposed between the uppermost surface of the upper insulating film 162 and the lower interlayer insulating film 190.

The upper interlayer insulating film 195 is formed on the lower interlayer insulating film 190, the first gate structure 115, and the second gate structure 215.

For example, the lower interlayer insulating film 190 and the upper interlayer insulating film 195 may each include silicon oxide, silicon nitride, silicon oxynitride, flowable oxide (FOX), tonen silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but is not limited thereto.

FIGS. 7A to 9 are each views provided to explain a semiconductor device according to some example embodiments. For convenience of explanation, differences with respect to FIGS. 1 to 6 will be mainly explained below.

Figure 7A:
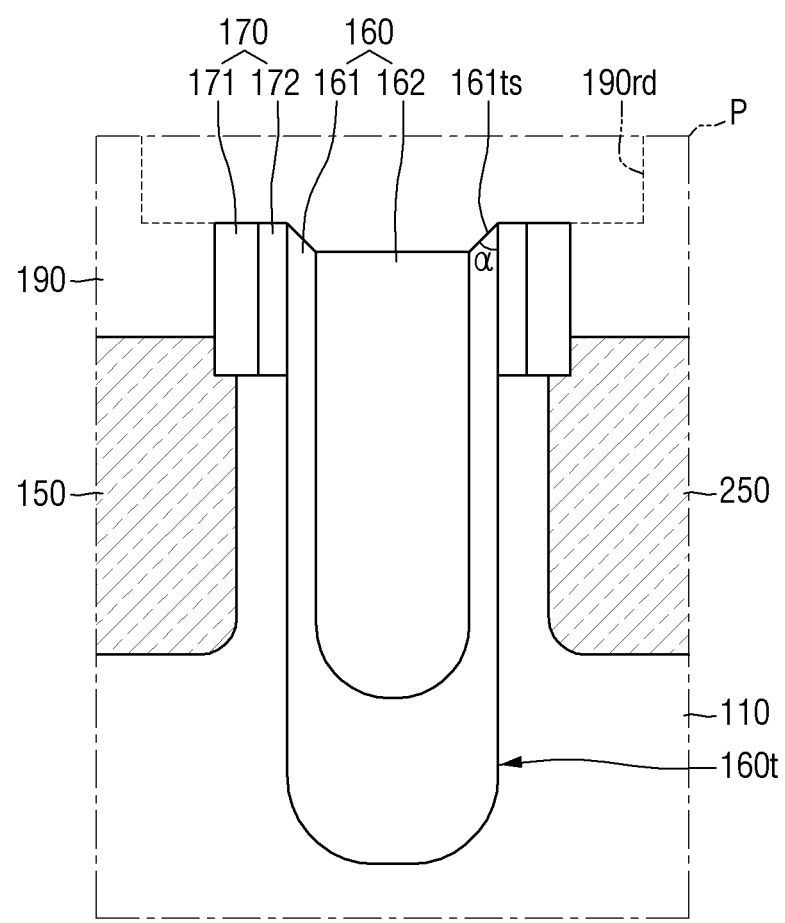
FIGS. 7A to 12 are each views provided to explain a semiconductor device according to some example embodiments.

Referring to FIG. 7A, in the semiconductor device according to some example embodiments, the uppermost surface 161ts of the first lower insulating film 161 may be an inclined surface. The first lower insulating film 161 formed on the sidewall of the first isolating trench 160t may have a chamfered shape.

The first lower insulating film 161 formed on the sidewall of the first isolating trench 160t may include a first (e.g., outer) sidewall facing the first dummy spacer 170 and a second (e.g., inner) sidewall facing the first upper insulating film 162. At this time, the uppermost surface 161ts of the first lower insulating film may have acute angle α with respect to the first sidewall facing the first dummy spacer 170.

The uppermost surface of the first upper insulating film 162 may be closer to the substrate 100 than the upper surface of the first dummy spacer 170.

FIG. 7A illustrates that a slope of the uppermost 161ts of the first lower insulating film is constant, but this is provided for convenience of explanation, and the example embodiments are not limited thereto.

Figure 7B:
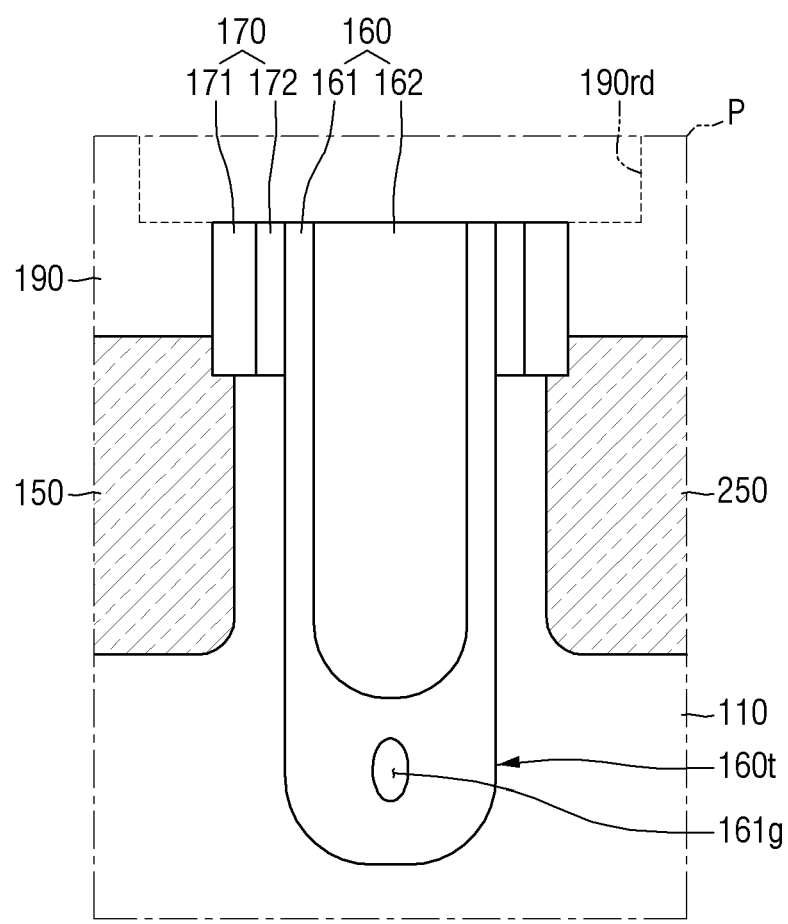

Referring to FIG. 7B, in the semiconductor device according to some example embodiments, the first device isolating film 160 may include an air gap (or other void) 161g formed in the first lower insulating film 161. The air gap 161g may be surrounded by the first lower insulating film 161.

Figure 7C:
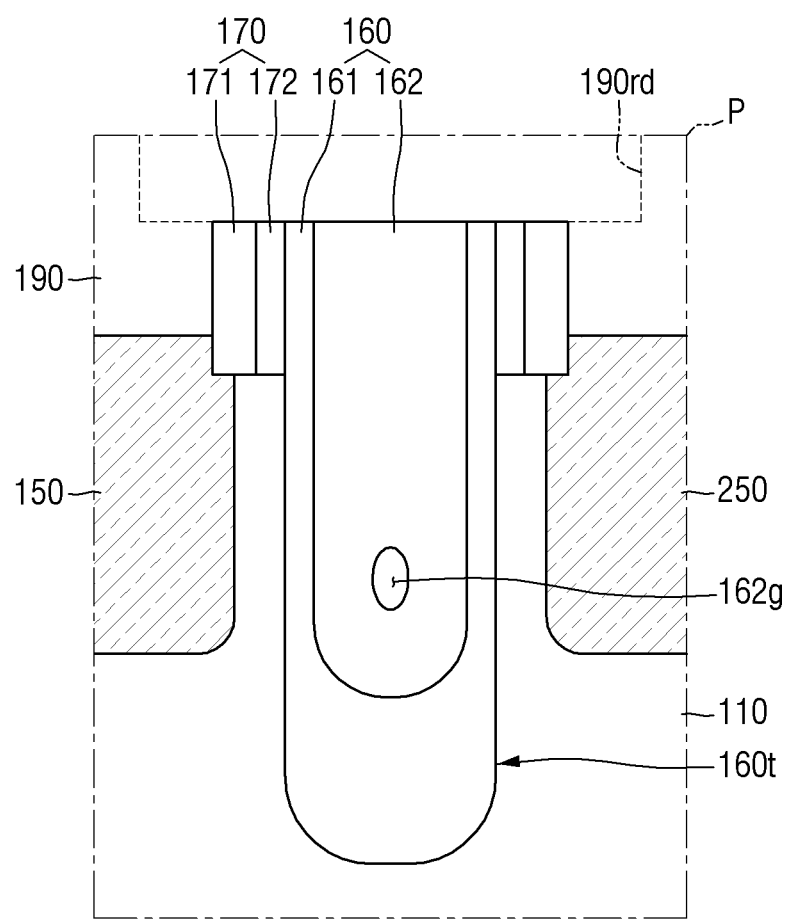

Referring to FIG. 7C, in the semiconductor device according to some example embodiments, the first device isolating film 160 may include an air gap (or other void) 162g formed in the first upper insulating film 162. The air gap 162g may be surrounded by the first upper insulating film 162.

Figure 8:
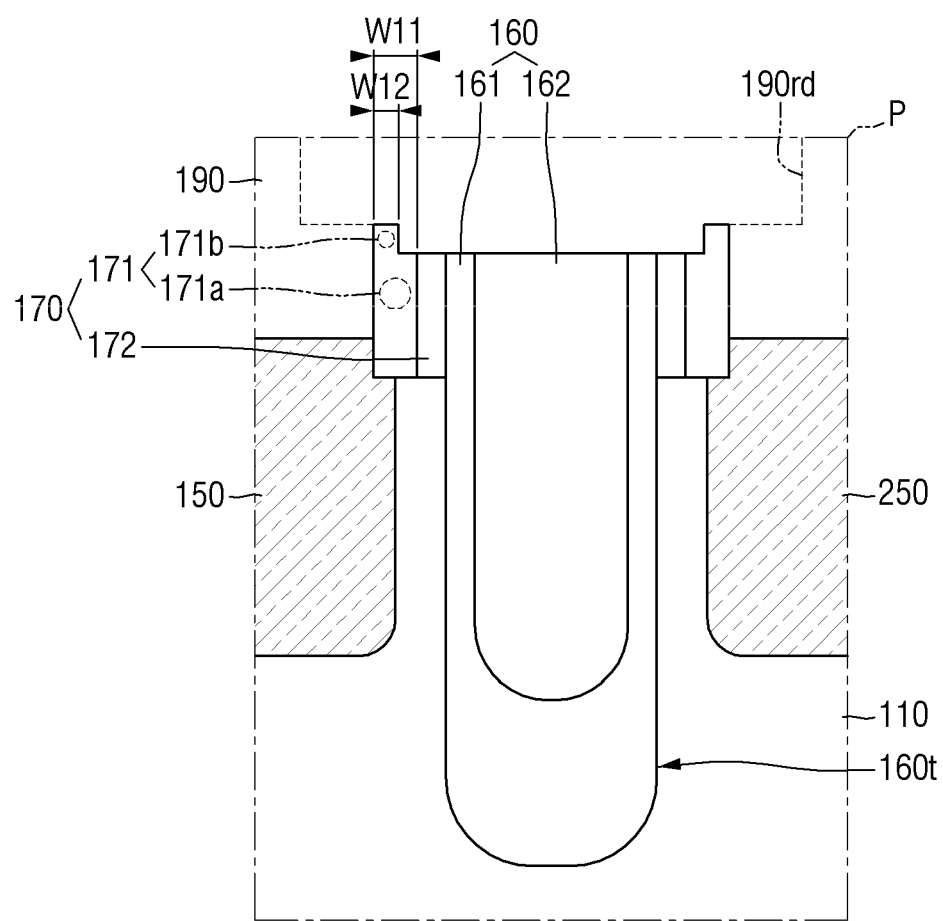

Referring to FIG. 8, in the semiconductor device according to some example embodiments, the first outer spacer 171 may include a lower portion 171a and an upper portion 171b having different widths from each other.

The upper portion 171b of the first outer spacer may be positioned on the lower portion 171a of the first outer spacer. For example, a width W12 of the upper portion 171b of the first outer spacer may be less than a width W11 of the lower portion 171a of the first outer spacer. The outer spacer 171 may be formed to have a stepped/stepwise shape.

In the semiconductor device according to some example embodiments, a height of the first outer spacer 171 may be greater than a height of the first inner spacer 172, with reference to the upper surface of the first fin-type pattern 110. More specifically, an upper surface height of the upper portion 171b of the first outer spacer may be greater than that of the first inner spacer 172, with reference to the upper surface of the first fin-type pattern 110.

A height from the upper surface of the first fin-type pattern 110 to the upper surface of the first upper insulating film 162 may be less than a height from the upper surface of the fin-type pattern 110 to the upper surface of the first dummy spacer 170. The first upper insulating film 162 may not entirely cover the upper surface of the first dummy spacer 170. A portion of the redeposited insulating film 190rd may be interposed between the upper portions 171b of the first outer spacer 171.

Figure 9:
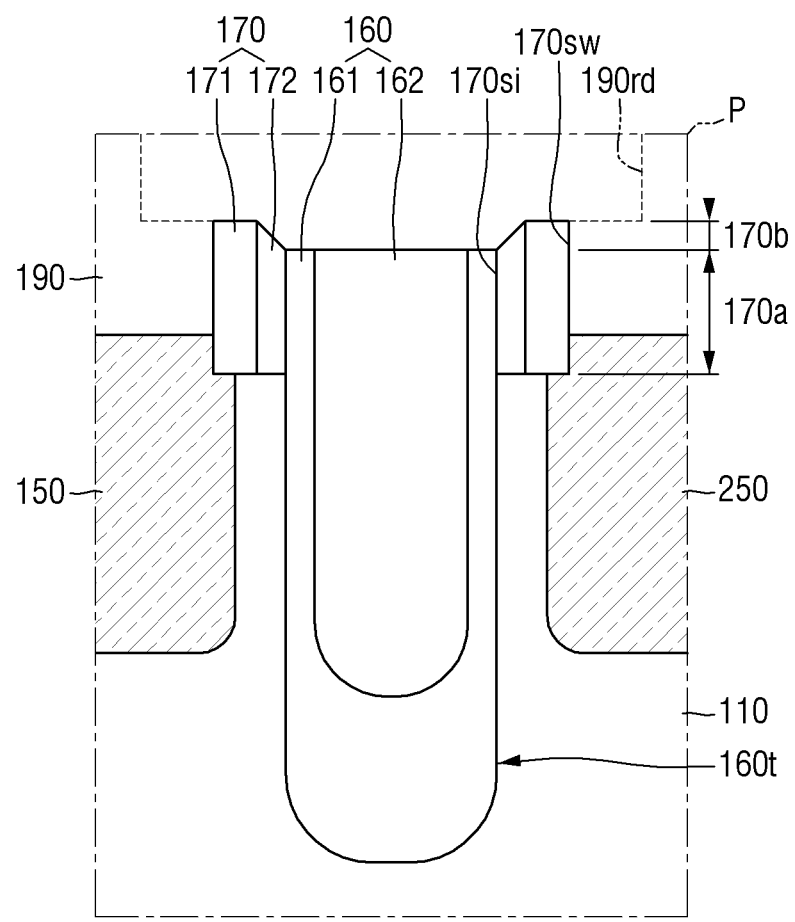

Referring to FIG. 9, in the semiconductor device according to some example embodiments, the first dummy spacer(s) 170 may include a lower portion 170a and an upper portion 170b.

While the lower portion 170a of the first dummy spacer(s) 170 is farther away from the upper surface of the first fin-type pattern 110, a width of the first dummy spacer(s) 170 may be constant. In contrast, as the upper portion 170b of the first dummy spacer(s) 170 is farther away from the upper surface of the first fin-type pattern 110, the width of the first dummy spacer(s) 170 may continuously decrease.

In other words, the first dummy spacer(s) 170 may include an inner sidewall 170si and an outer sidewall 170sw which are facing each other. The inner sidewall 170si of the first dummy spacer(s) 170 is included in the first inner spacer 172, and faces the first device isolating film 160. The outer sidewall 170sw of the first dummy spacer(s) 170 is included in the first outer spacer 171, and faces the lower interlayer insulating film 190.

In the semiconductor device according to some example embodiments, a height of the outer sidewall 170sw of the first dummy spacer may be greater than that of the inner sidewall 170si of the first dummy spacer(s) 170, with reference to the upper surface of the first fin-type pattern 110.

FIG. 9 illustrates that a width of the upper portion 170b of the first dummy spacer(s) 170 decreases constantly (i.e., at a constant rate) as it is farther away from the upper surface of the first fin-type pattern 110, but is not limited thereto.

Further, as illustrated, the upper surface of the first inner spacer 172 may be an inclined surface to the upper surface of the first fin-type pattern 110, and the upper surface of the first outer spacer 171 may be parallel to the upper surface of the first fin-type pattern 110, but is not limited thereto.

Figure 10:
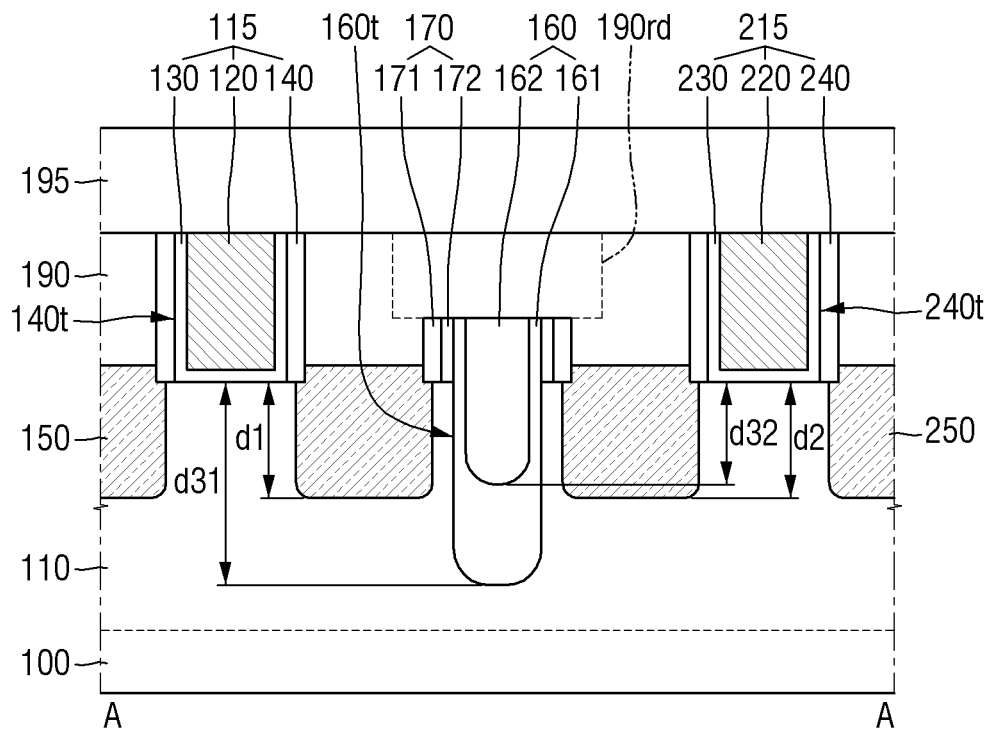
Figure 11:
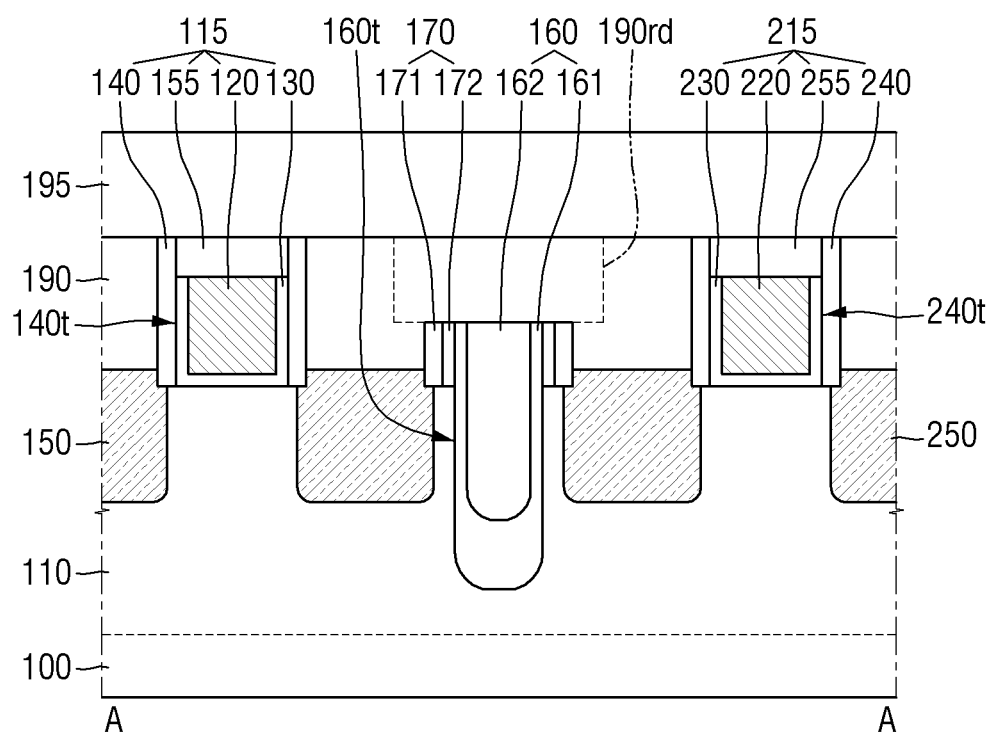

FIGS. 10 and 11 are each views provided to explain a semiconductor device according to some example embodiments. For convenience of explanation, differences with respect to FIGS. 1 to 6 will be mainly explained below.

Referring to FIG. 10, in a semiconductor device according to some example embodiments, the depth d32 from the upper surface of the first fin-type pattern 110 to the lowermost portion of the first upper insulating film 162 may be less than the depth d1 from the upper surface of the fin-type pattern 110 to the lower surface of the first epitaxial pattern 150.

Further, the depth d32 from the upper surface of the first fin-type pattern 110 to the lowermost portion of the first upper insulating film 162 may be less than the depth d2 from the upper surface of the fin-type pattern 110 to the lower surface of the second epitaxial pattern 250.

Alternatively, unlike FIG. 10, the depth d32 from the upper surface of the first fin-type pattern 110 to the lowermost portion of the first upper insulating film 162 may be substantially same as the depth d1 from the upper surface of the first fin-type pattern 110 to the lower surface of the first epitaxial pattern 150 and the depth d2 from the upper surface of the fin-type pattern 110 to the lower surface of the second epitaxial pattern 250.

Referring to FIG. 11, in a semiconductor device according to some example embodiments, the first gate structure 115 may additionally include a first gate capping pattern 155, and the second gate structure 215 may additionally include a second gate capping pattern 255.

The first gate electrode 120 may fill a portion of the first gate trench 140t. The first gate capping pattern 155 may be formed on the first gate electrode 120. The first gate capping pattern 155 may fill the rest of the first gate trench 140t remaining after the first gate electrode 120 is formed.

The second gate electrode 220 may fill a portion of the second gate trench 240t. The second gate capping pattern 255 may be formed on the second gate electrode 220. The second gate capping pattern 255 may fill the rest of the second gate trench 240t remaining after the second gate electrode 220 is formed.

While FIG. 11 illustrates that the first gate insulating film 130 is not formed between the first gate spacer 140 and the first gate capping pattern 155, and the second gate insulating film 230 is not formed between the second gate spacer 240 and the second gate capping pattern 255, this is provided only for convenience of explanation and the example embodiments are not limited thereto.

In some embodiments, the upper surface of the first gate capping pattern 155 and the upper surface of the second gate capping pattern 255 may be coplanar with the upper surface of the lower interlayer insulating film 190.

The first gate capping pattern 155 and the second gate capping pattern 255 may include, for example, a material having an etch selectivity relative to the lower interlayer insulating film 190. The first gate capping pattern 155 and the second gate capping pattern 255 may include at least one of silicon nitride (SiN), silicon oxynitride (SiON), silicon oxide ($SiO_2$), silicon carbon nitride (SiCN), silicon oxycarbon nitride (SiOCN), and a combination thereof, for example.

Figure 12:
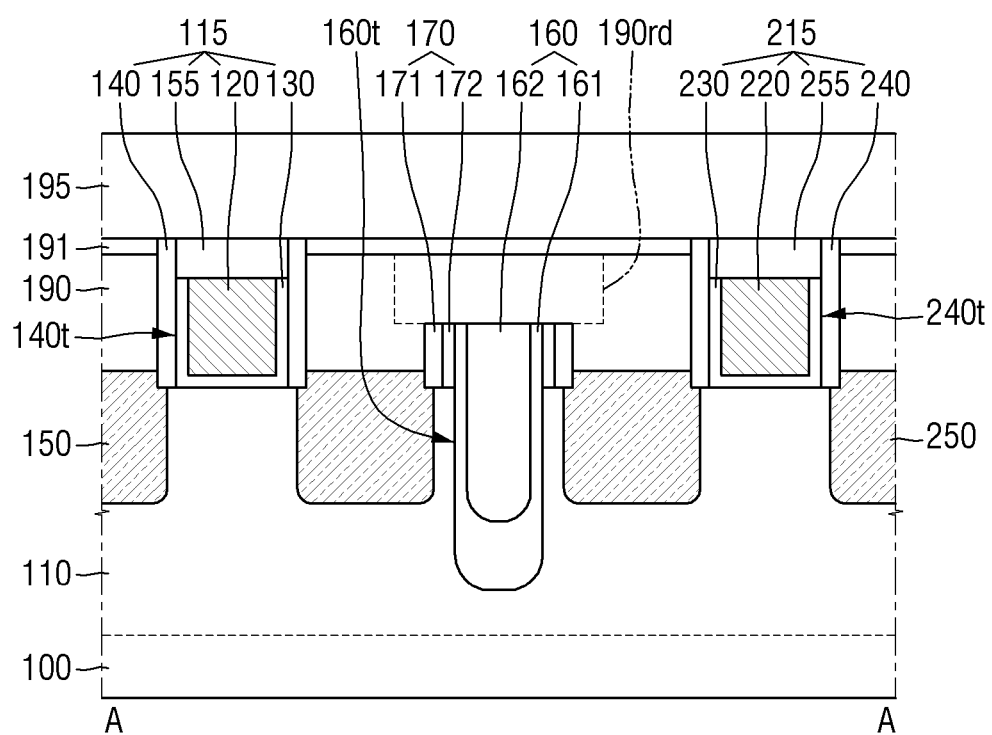

FIG. 12 is a view provided to explain a semiconductor device according to some example embodiments. For convenience of explanation, differences with respect to FIG. 11 will be mainly explained below.

Referring to FIG. 12, the semiconductor device according to some example embodiments may additionally include an interlayer insulating film protective film 191 formed between the lower interlayer insulating film 190 and the upper interlayer insulating film 195.

An upper surface of the interlayer insulating film protective film 191 may be coplanar with an upper surface of the first gate structure 115 and an upper surface of the second gate structure 215.

The interlayer insulating film protective film 191 may play a role of protecting the lower interlayer insulating film 190 disposed underneath the interlayer insulating film protective film 191 in the process of fabrication. As a result, reliability of the semiconductor device may be enhanced. The interlayer insulating film protective film 191 may for example include silicon nitride, but is not limited thereto.

Figure 13:
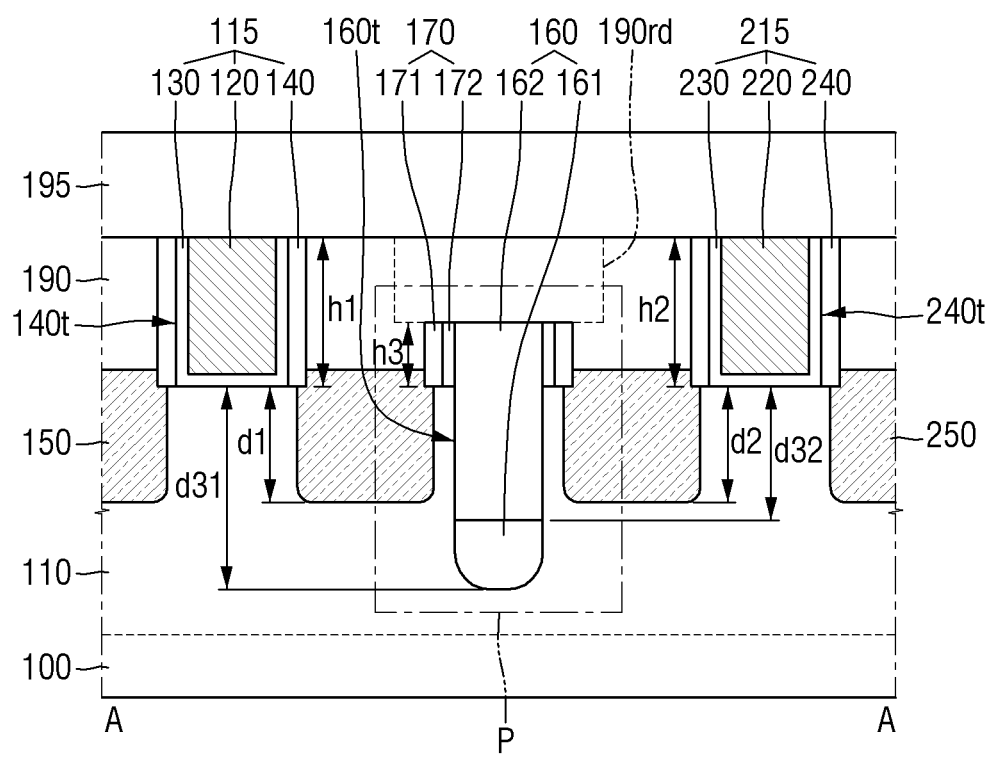
FIGS. 13 and 14 are views provided to explain a semiconductor device according to some example embodiments of the present disclosure.
Figure 14:
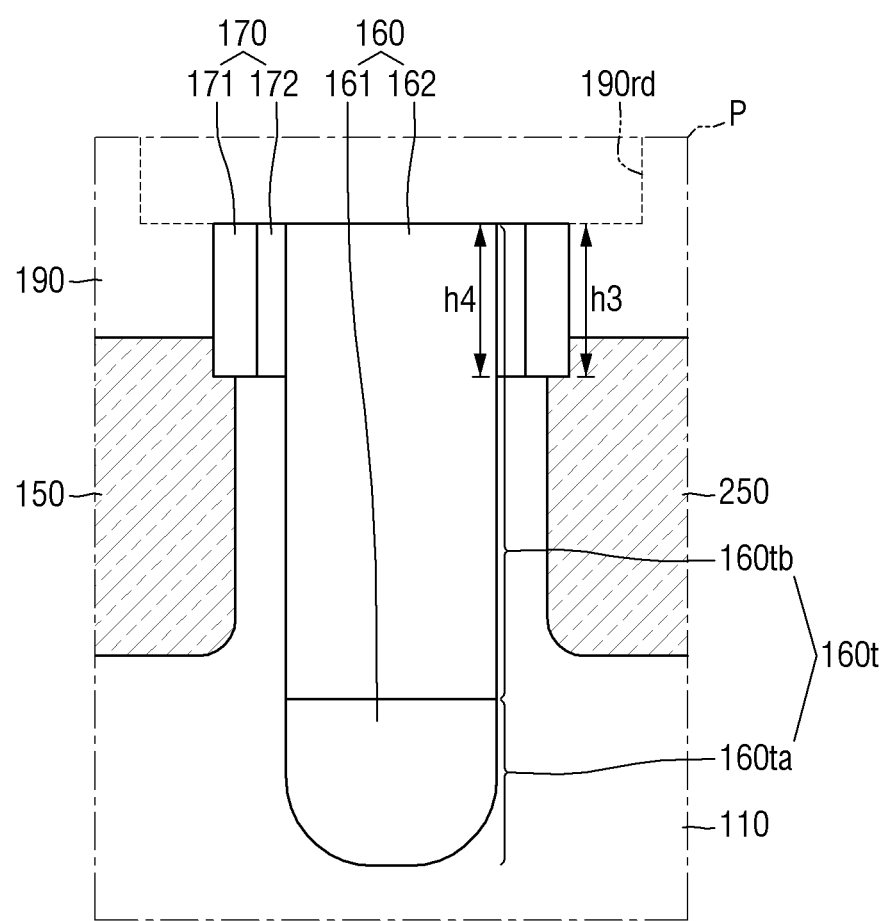

FIGS. 13 and 14 are views provided to explain a semiconductor device according to some example embodiments of the present disclosure. For reference, FIG. 14 is an enlarged view of a section P of FIG. 13. For convenience of explanation, differences with respect to FIGS. 1 to 6 will be mainly explained below.

Referring to FIGS. 13 and 14, in the semiconductor device according to some example embodiments, the first upper insulating film 162 may cover the entire uppermost surface of the first lower insulating film 161, and sidewalls of the first upper insulating film 162 may be free of the first lower insulating film 161. Further, the uppermost surface of the first lower insulating film 161 may not be in contact with the lower interlayer insulating film 190.

The first isolating trench 160*t* may include a first portion 160*ta* in which a sidewall is defined by the first fin-type pattern 110, and a first portion 160*tb* in which a sidewall is defined by the first dummy spacer 170.

The first lower insulating film 161 may fill the first portion 160*ta* of the first isolating trench which is a part of the first isolating trench 160*t*. The first lower insulating film 161 may not include a portion extending along a sidewall of the second portion 160*tb* of the first isolating trench. The first lower insulating film 161 may not include a portion extending along a sidewall of the first dummy spacer 170.

The first upper insulating film 162 may fill the second portion 160*tb* of the first isolating trench, while covering the uppermost surface of the first lower insulating film 161. In a semiconductor device according to some example embodiments, the first lower interlayer insulating film 190 and the first upper interlayer insulating film 195 may be formed in a lamination structure.

In a semiconductor device according to some example embodiments, the depth d32 from the upper surface of the first fin-type pattern 110 to the lower surface of the first upper insulating film 162 may be substantially the same as the depth from the upper surface of the first fin-type pattern 110 to the upper surface of the first lower insulating film 161.

Accordingly, the depth d32 from the lower surface of the first fin-type pattern 110 to the upper surface of the first lower insulating film 161 is greater than the depth d1 from the upper surface of the first fin-type pattern 110 to the lower surface of the first epitaxial pattern 150 and the depth d2 from the upper surface of the first fin-type pattern 110 to the lower surface of the second epitaxial pattern 250.

The height h4 from the upper surface of the first fin-type pattern 110 to the upper surface of the first upper insulating film 162 may be substantially the same as the height h3 from the upper surface of the fin-type pattern 110 to the upper surface of the first dummy spacer 170.

In some embodiments, the first device isolating film 160 may additionally include an air gap (or other void) formed in the first lower insulating film 161 and/or an air gap (or other void) formed in the first upper insulating film 162.

Figure 15:
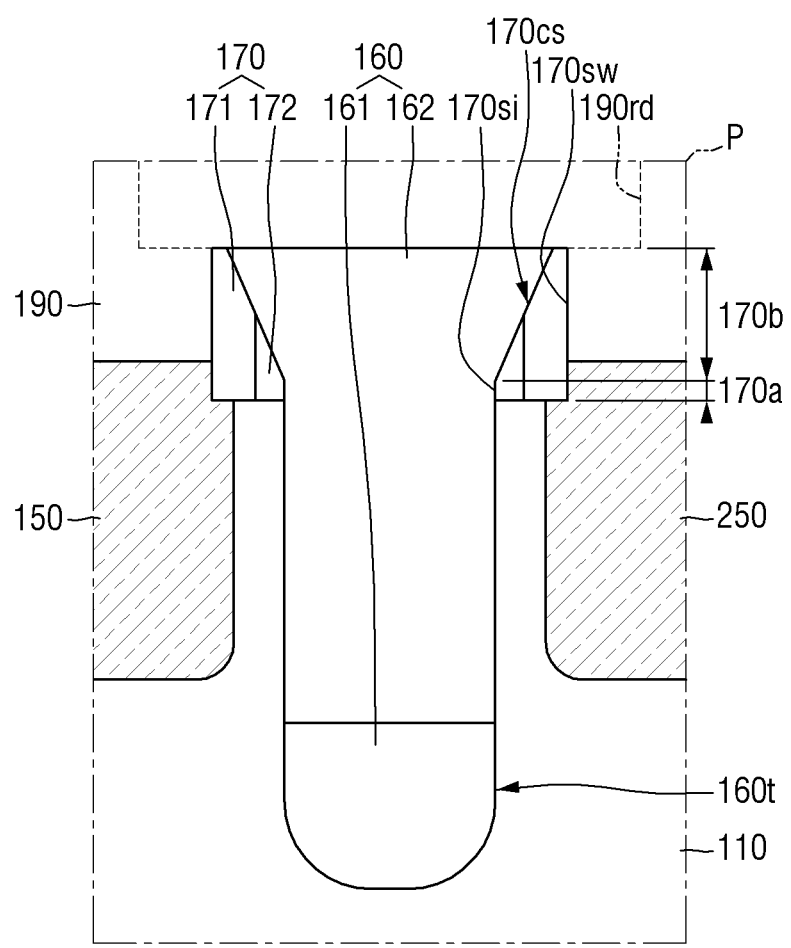
FIGS. 15 to 17 are each views provided to explain a semiconductor device according to some example embodiments of the present disclosure.
Figure 16A:
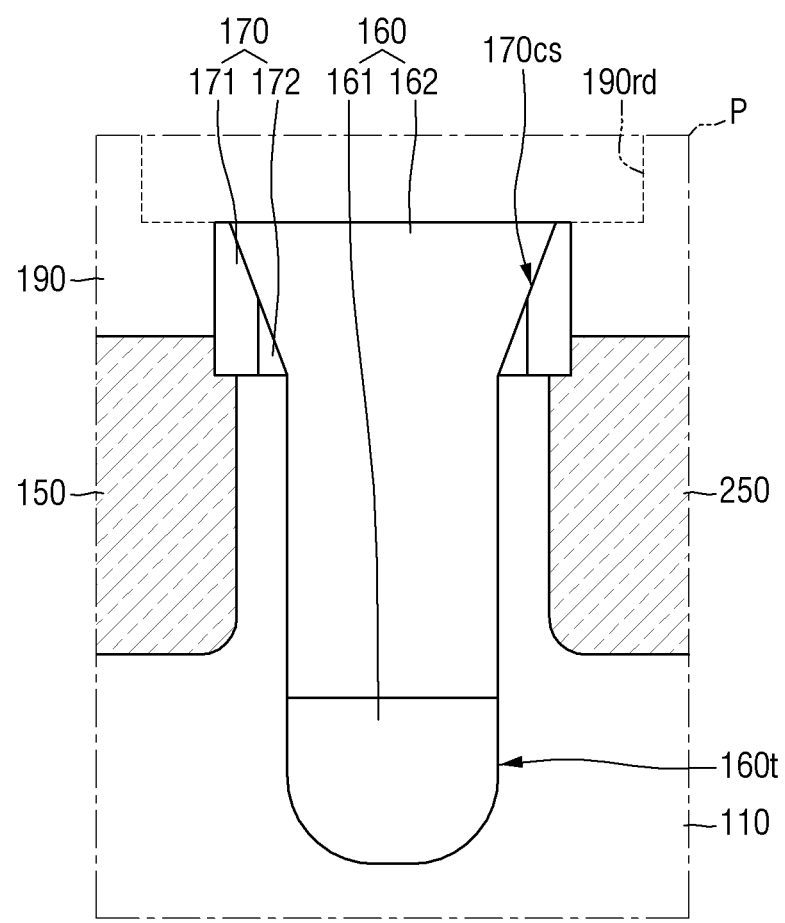
Figure 16B:
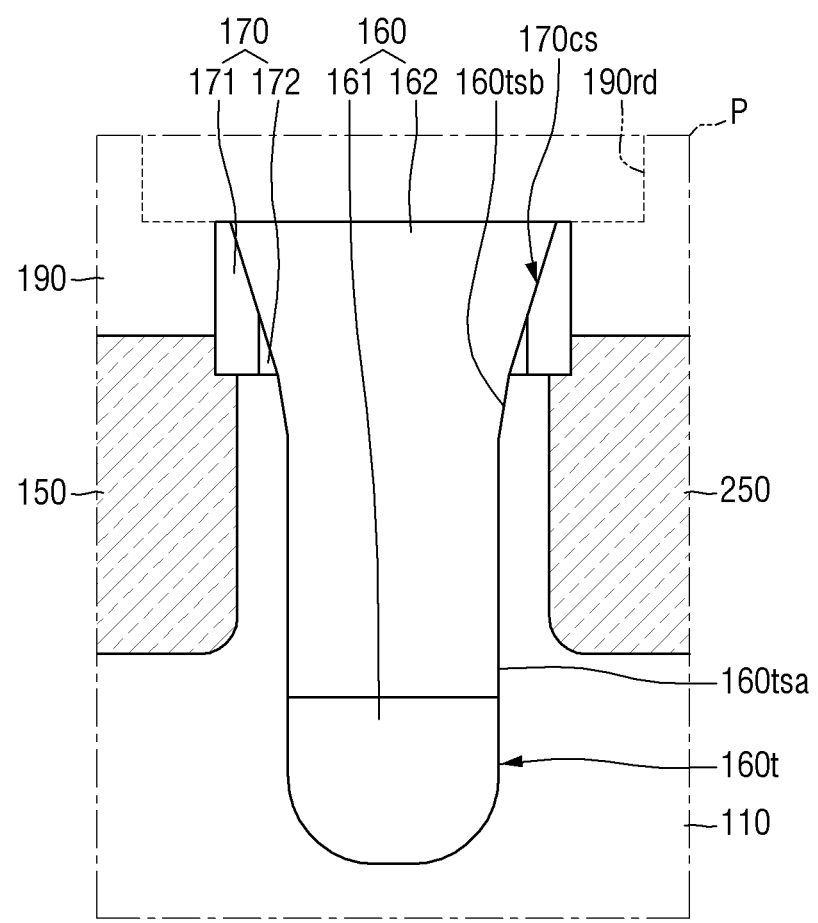

FIGS. 15 to 16B are each views provided to explain a semiconductor device according to some example embodiments. For convenience of explanation, differences with respect to FIGS. 13 and 14 will be mainly explained below. For reference, FIGS. 15 to 16B are enlarged views of a section P of FIG. 13.

Referring to FIG. 15, in the semiconductor device according to some example embodiments, the first dummy spacer(s) 170 may include a lower portion 170*a* and an upper portion 170*b*. The lower portion 170*a* of the first dummy spacer(s) 170 is adjacent the upper surface of the first fin-type pattern 110 and provides a width of the first dummy spacer(s) 170 that may be constant. Meanwhile, as the upper portion 170*b* of the first dummy spacer(s) 170 is farther away from the upper surface of the first fin-type pattern 110, the width of the first dummy spacer(s) 170 may continuously decrease. According the width of the upper portion 170*b* varies with distance from the upper surface of the first fin-type pattern 110.

A height of the outer sidewall 170*sw* of the first dummy spacer(s) 170 may be greater than a height of the inner sidewall 170*si* of the first dummy spacer(s) 170, relative to the upper surface of the first fin-type pattern 110.

The first dummy spacer(s) 170 may include a connection inclined surface 170*cs* connecting the inner sidewall 170*si* of the first dummy spacer(s) 170 with the upper surface of the first dummy spacer(s) 170. The connection inclined surface 170*cs* of the first dummy spacer(s) 170 may be formed by etching the first inner spacer 172 and the first outer spacer 171.

Referring to FIG. 16A, in the semiconductor device according to some example embodiments, a width of the first dummy spacer(s) 170 may decrease continuously as it is farther away from the upper surface of the first fin-type pattern 110.

The first dummy spacer(s) 170 may not include a portion where the width of the first dummy spacer(s) 170 is constant while it is farther away from the upper surface of the first fin-type pattern 110.

The first dummy spacer(s) 170 may include a connection inclined surface 170*cs* connecting the bottom surface of the first dummy spacer(s) 170 with the upper surface of the first dummy spacer(s) 170.

Referring to FIG. 16B, in the semiconductor device according to some example embodiments, a sidewall of the first isolating trench 160*t* defined by the first fin-type pattern 110 may include a first sidewall 160*tsa* having a first slope and a second sidewall 160*tsb* having a second slope which is different from the first slope.

The sidewall of the first isolating trench 160*t* may additionally include a portion connected with the second sidewall 160*tsb*, and defined by a connection inclined surface 170*cs* of the first dummy spacer(s) 170.

In the formation of the first lower insulating film 161, the connection inclined surface 170*cs* of the first dummy spacer(s) 170, and a second sidewall 160*tsb* of the first isolating trench 160*t* may be formed. In other words, because a process by which the second sidewall 160*tsb* of the first isolating trench 160*t* is formed is a different process from a process by which the first sidewall 160*tsa* of the first isolating trench 160*t* is formed, a slope of the second sidewall 160*tsb* of the first isolating trench 160*t* may be different from a slope of the first sidewall 160*tsa* of the first isolating trench 160*t*.

A width of the first dummy spacer 170 may decrease continuously as it is farther away from the upper surface of the first fin-type pattern 110.

Figure 17:
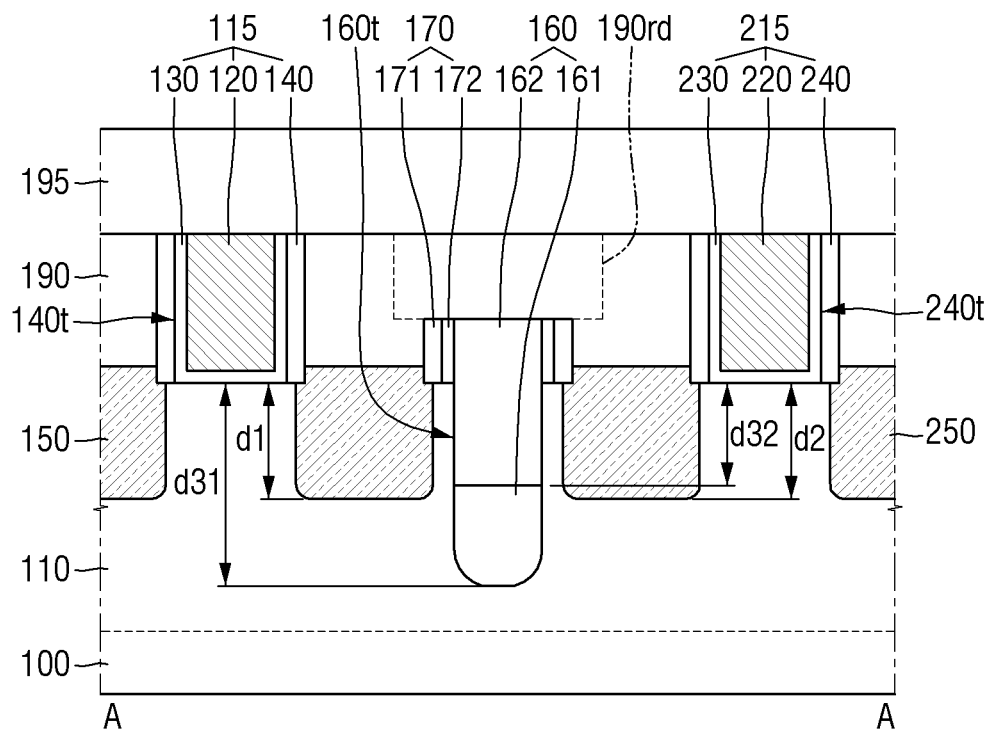

FIG. 17 is a view provided to explain a semiconductor device according to some example embodiments of the present disclosure. For convenience of explanation, differences with respect to FIGS. 13 and 14 will be mainly explained below.

Referring to FIG. 17, in a semiconductor device according to some example embodiments, the depth d32 from the upper surface of the first fin-type pattern 110 to the upper surface of the first lower insulating film 161 is less than the depth d1 from the upper surface of the first fin-type pattern 110 to the lower surface of the first epitaxial pattern 150 and the depth d2 from the upper surface of the first fin-type pattern 110 to the lower surface of the second epitaxial pattern 250.

Figure 18:
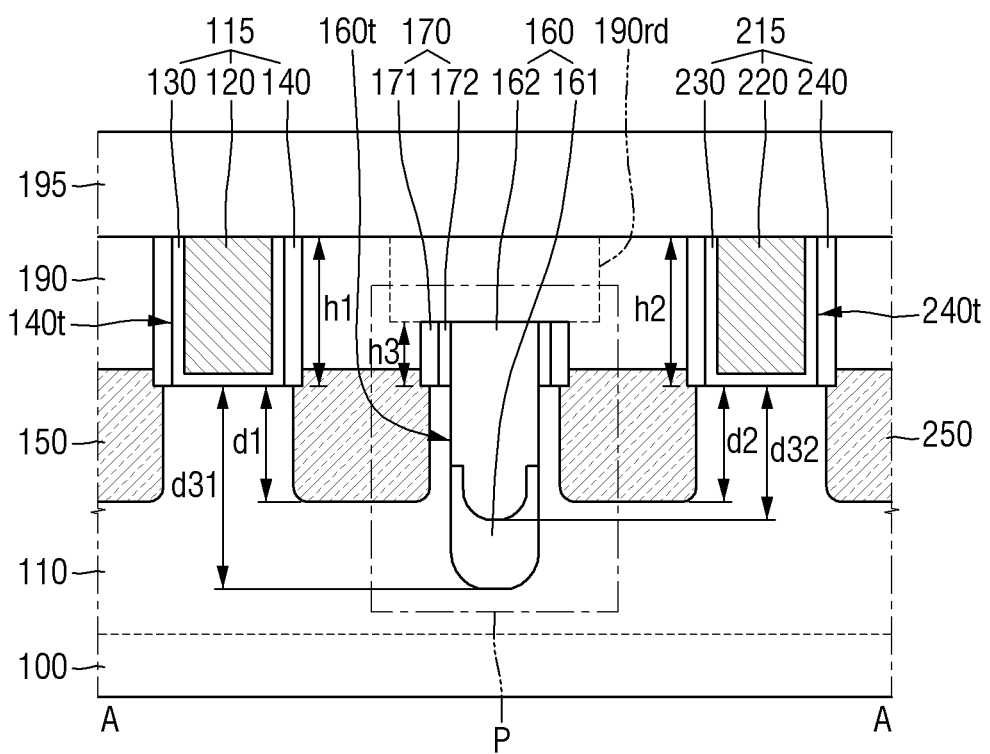
FIGS. 18 and 19 are views provided to explain a semiconductor device according to some example embodiments of the present disclosure.
Figure 19:
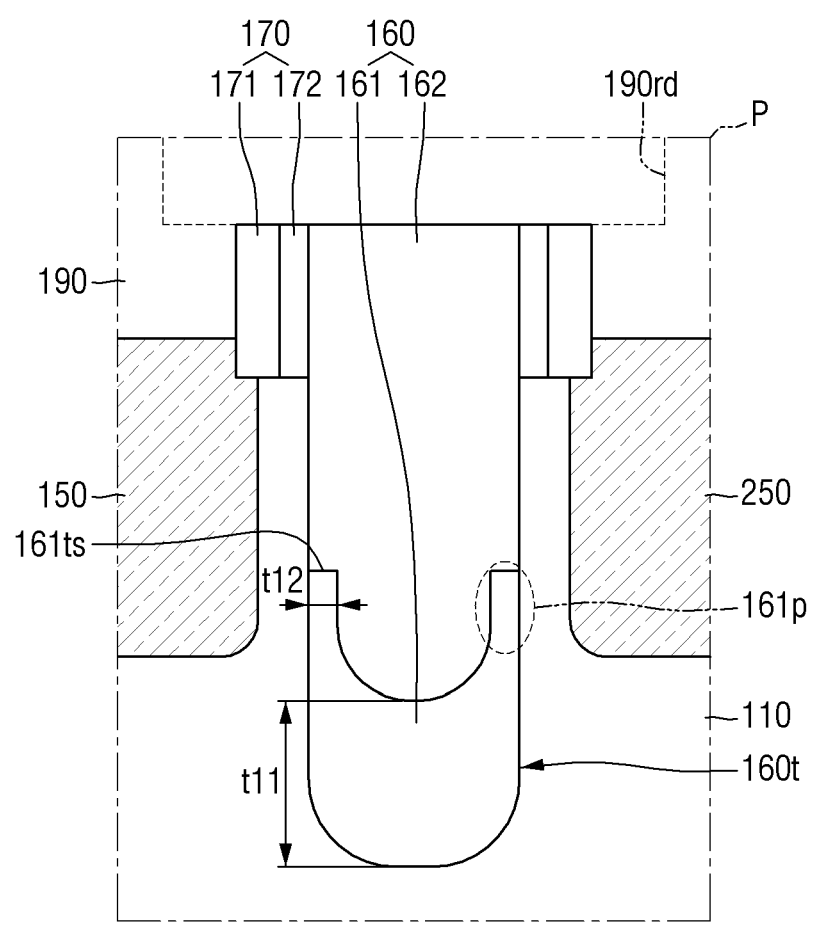

FIGS. 18 and 19 are views provided to explain a semiconductor device according to some example embodiments of the present disclosure. For reference, FIG. 19 is an enlarged view of a section P of FIG. 18. For convenience of explanation, differences with respect to FIGS. 13 and 14 will be mainly explained below.

Referring to FIGS. 18 and 19, in a semiconductor device according to some example embodiments, the first lower insulating film 161 may include a protrusion 161*p* extending along the sidewall of the first isolating trench 160*t*. That is, the first lower insulating film 161 may be formed along a portion of the sidewall, and the bottom surface, of the first isolating trench 160*t*.

In a semiconductor device according to some example embodiments, a thickness t11 of the first lower insulating film 161 formed on the bottom surface of the first isolating trench 160*t* is greater than a thickness t12 of the protrusion 161*p* of the first lower insulating film 161.

The uppermost surface 161*ts* of the protrusion 161*p* of the first lower insulating film may be covered by the first upper insulating film 162, and may be in contact with the first upper insulating film 162. It is to be noted that, while it is illustrated in FIG. 19 that the protrusion 161*p* of the first lower insulating film does not include a portion extending along the sidewall of the first dummy spacer 170, example embodiments are not limited thereto.

Figure 20:
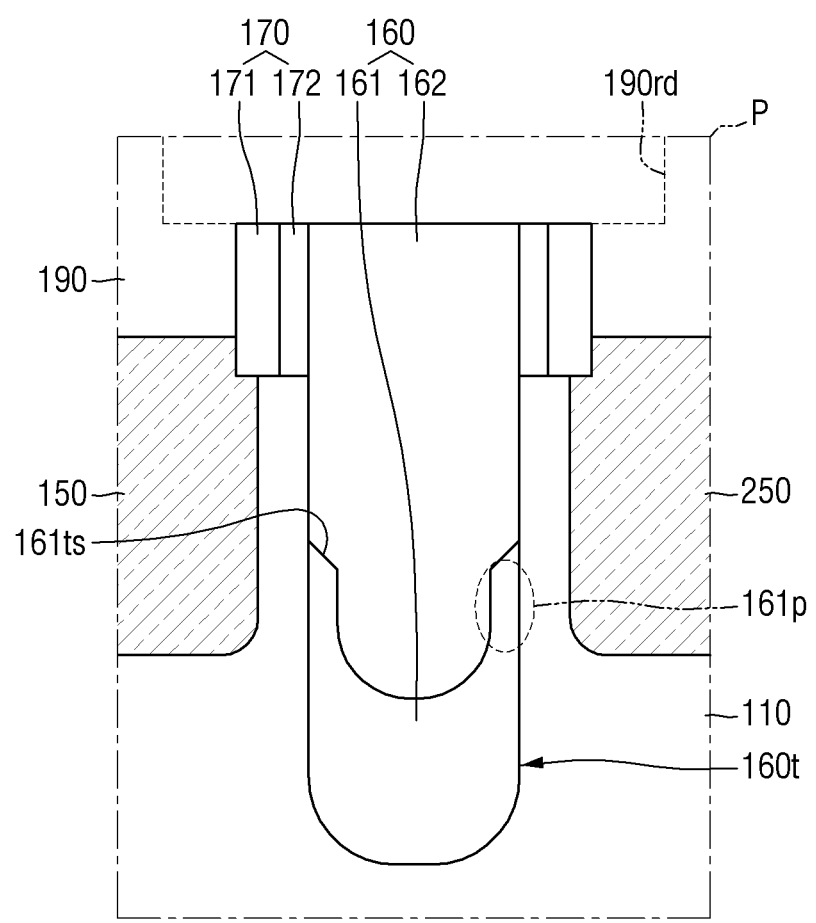
FIGS. 20 and 21 are each views provided to explain a semiconductor device according to some example embodiments of the present disclosure.
Figure 21:
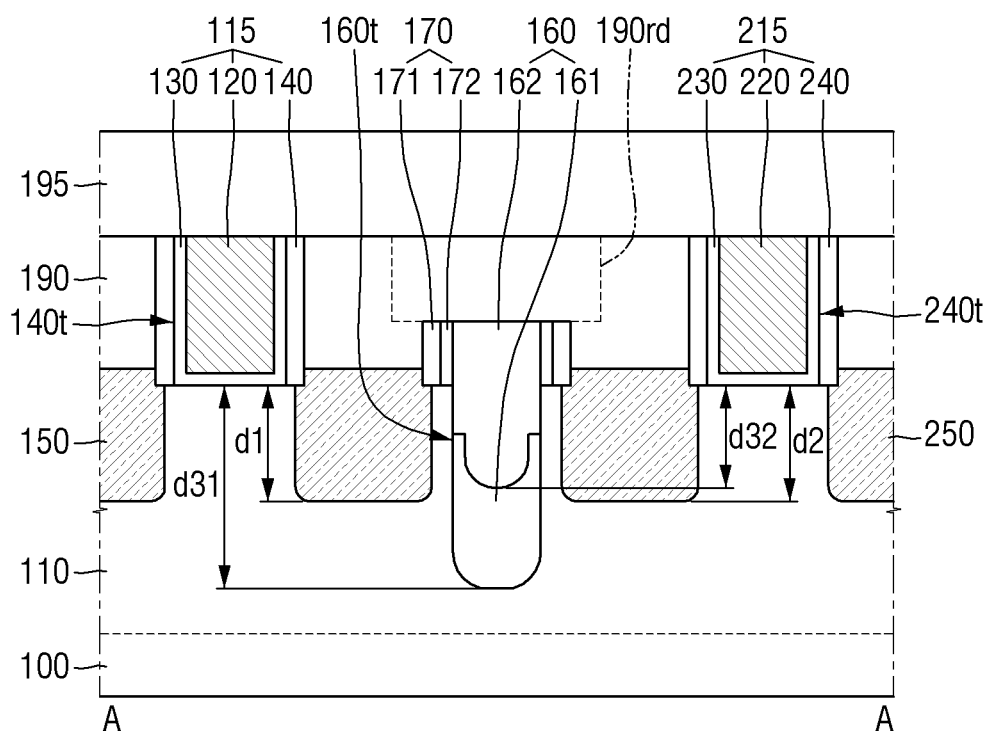

FIGS. 20 and 21 are each views provided to explain a semiconductor device according to some example embodiments of the present disclosure. For convenience of explanation, differences with respect to FIGS. 18 and 19 will be mainly explained below.

Referring to FIG. 20, in a semiconductor device according to example embodiments, the uppermost surface 161*ts* of the protrusion 161*p* of the first lower insulating film 161 may be an inclined surface having a slope adjacent a sidewall of the first isolating trench 160*t*.

The uppermost surface 161*ts* of the protrusion 161*p* of the first lower insulating film may be chamfered.

Referring to FIG. 21, in a semiconductor device according to some example embodiments, the depth d32 from the upper surface of the first fin-type pattern 110 to the upper surface of the first lower insulating film 161 is less than the depth d1 from the upper surface of the first fin-type pattern 110 to the lower surface of the first epitaxial pattern 150 and the depth d2 from the upper surface of the fin-type pattern 110 to the lower surface of the second epitaxial pattern 250.

Figure 22:
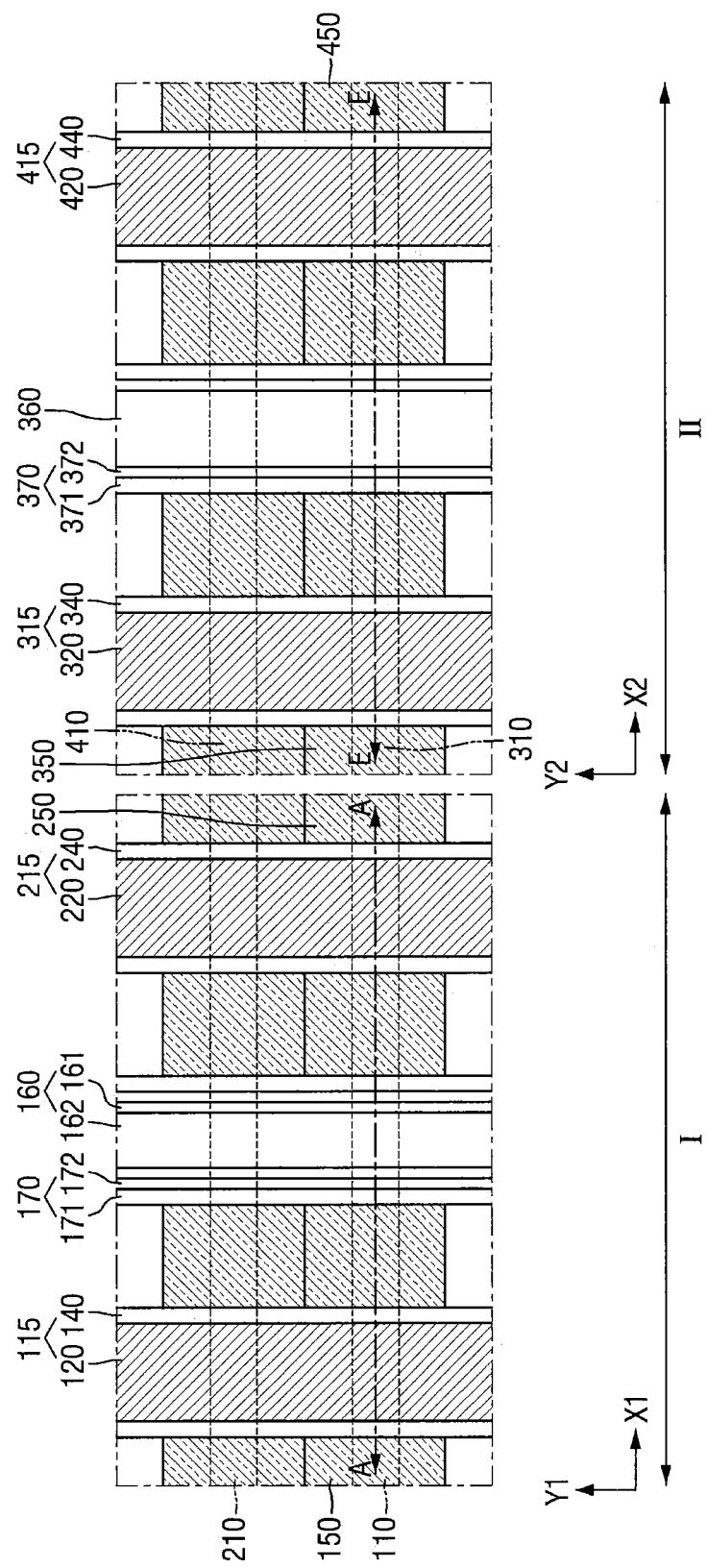
FIG. 22 is a schematic top view provided to explain a semiconductor device according to some example embodiments.
Figure 23:
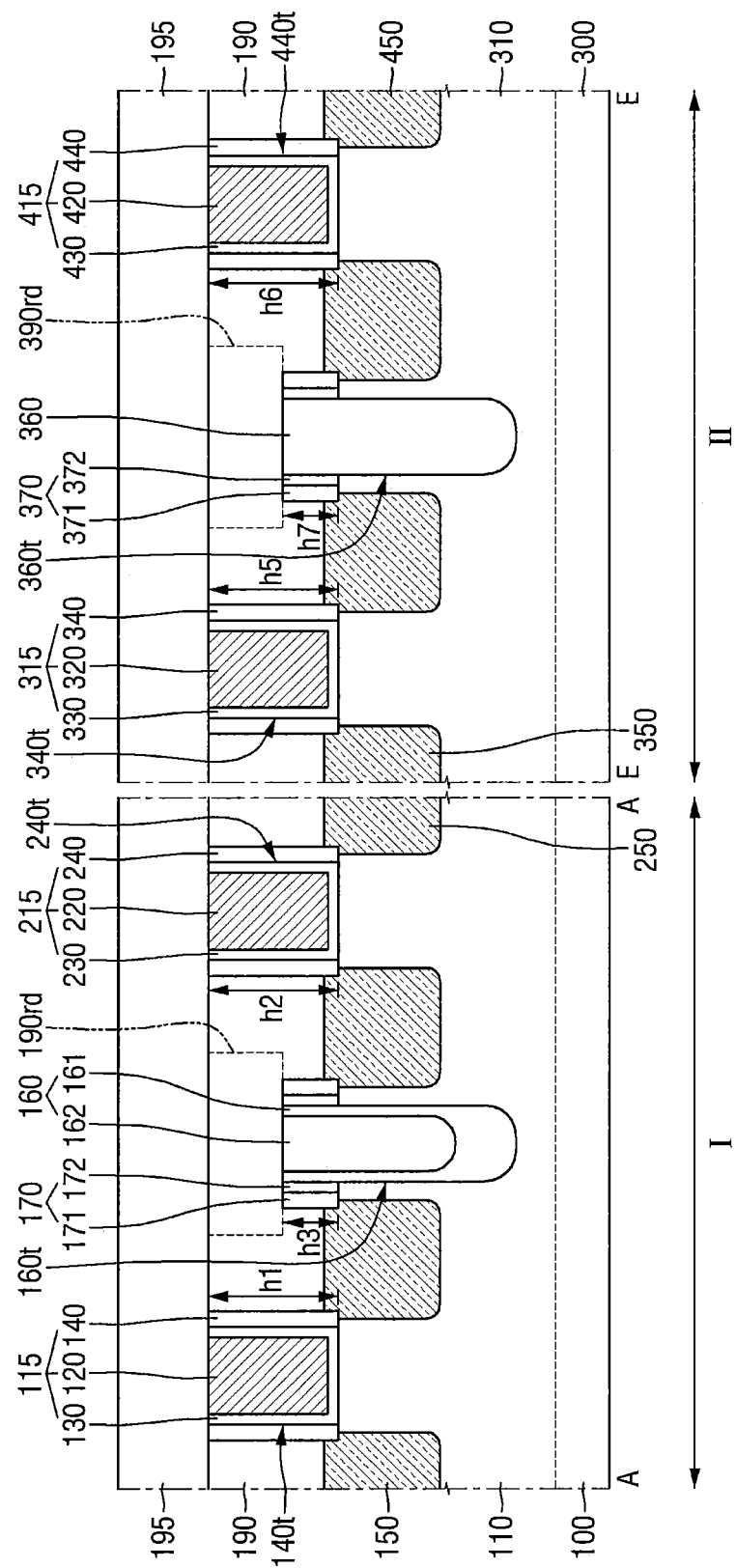
FIG. 23 is a cross sectional view taken along lines A-A and E-E of FIG. 22.

FIG. 22 shows a schematic top view provided to explain a semiconductor device according to some example embodiments. FIG. 23 is a cross sectional view taken along lines A-A and E-E of FIG. 22.

For reference, FIG. 22 omits illustration of the first and second interlayer insulating films 190, 195, and the first to fourth gate insulating films 130, 230, 330, 430 for convenience of explanation. Referring to FIG. 22, a second region II will be mainly described, since some of the description for a first region I would overlap with the description provided above with reference to FIGS. 1 to 6. Further, it is apparent that although the first region I in FIG. 23 is illustrated similarly to FIG. 2, it may be one of various embodiments explained with reference to FIGS. 1 to 12.

Referring to FIGS. 22 and 23, the semiconductor device according to some example embodiments may additionally include a first fin-type pattern 110, a second fin-type pattern 210, a first gate structure 115, a second gate structure 215, a first device isolating film 160, a first dummy spacer 170, a first epitaxial pattern 150, 150_1, and a second epitaxial pattern 250.

A substrate 100 may include a first region I and a second region II. The first region I and the second region II may be spaced apart from each other, or may be regions that are connected to each other. For example, different types of transistors may be formed in the first region I and the second region II. That is, when the first region I is a region where a first conductivity type of transistor is formed, the second region II may be a region where a second conductivity type of transistor is formed, wherein the second conductivity type is different from the first conductivity type.

The third fin-type pattern 310 and the fourth fin-type pattern 410 may extend longitudinally on the substrate 100 in the second region II and along a third direction X2. The third fin-type pattern 310 and the fourth fin-type pattern 410 may protrude from the substrate 100. The third fin-type pattern 310 and the fourth fin-type pattern 410 may be arranged in a fourth direction Y2.

The third gate structure 315 and the fourth gate structure 415 may extend in the fourth direction Y2, respectively. The third gate structure 315 and the fourth gate structure 415 may be formed on the third fin-type pattern 310 and the fourth fin-type pattern 410 to intersect the third fin-type pattern 310 and the fourth fin-type pattern 410, respectively. The third gate structure 315 and the fourth gate structure 415 may be spaced apart from each other in the third direction X2.

The third gate structure 315 may include a third gate electrode 320, a third gate insulating film 330, a third gate spacer 340, and a third gate trench 340*t* defined by the third gate spacer 340.

The fourth gate structure 415 may include a fourth gate electrode 420, a fourth gate insulating film 430, a fourth gate spacer 440, and a fourth gate trench 440t defined by the fourth gate spacer 440.

The third gate electrode 320 and the fourth gate electrode 420 may each be formed on the third fin-type pattern 310, the field insulating film 105, and the fourth fin-type pattern 410. A third gate spacer 340 may be formed on a sidewall of the third gate electrode 320. A fourth gate spacer 440 may be formed on a sidewall of the fourth gate electrode 420. The third gate insulating film 330 may be formed between the third fin-type pattern 310 and the third gate electrode 320, and between the fourth fin-type pattern 410 and the third gate electrode 320. The third gate insulating film 330 may be formed along the sidewall and the bottom surface of the third gate trench 340t. The fourth gate insulating film 430 may be formed between the third fin-type pattern 310 and the fourth gate electrode 420, and between the fourth fin-type pattern 410 and the fourth gate electrode 420. The fourth gate insulating film 430 may be formed along the sidewall and the bottom surface of the fourth gate trench 440t. A third epitaxial pattern 350 may be formed on opposite sides of the third gate structure 315. A fourth epitaxial pattern 450 may be formed on opposite sides of the fourth gate structure 415.

A pair of second dummy spacers 370 may be disposed between the third gate spacer 340 and the fourth gate spacer 440 that face each other. The second dummy spacer(s) 370 may be disposed on the third fin-type pattern 310 and the fourth fin-type pattern 410, and intersect the third fin-type pattern 310 and the fourth fin-type pattern 410. The second dummy spacer(s) 370 may include a second inner spacer 372 and a second outer spacer 371. The second inner spacer 372 may be located between the second outer spacer 371 and the second device isolating film 360.

In a semiconductor device according to some example embodiments, a height h7 from the upper surface of the third fin-type pattern 310 to the upper surface of the second dummy spacer(s) 370 is less than a height h5 from the upper surface of the third fin-type pattern 310 to the upper surface of the third gate spacer 340 and a height h6 from the upper surface of the third fin-type pattern 310 to the upper surface of the fourth gate spacer 440.

The second isolating trench 360t may be formed between the second dummy spacers 370. The second isolating trench 360t may include a sidewall defined by the third fin-type pattern 310 and the second dummy spacer(s) 370.

The second device isolating film 360 may be formed in the second isolating trench 360t. The second device isolating film 360 may fill the second isolating trench 360t. The second device isolating film 360 may be spaced apart from the third epitaxial pattern 350 and the fourth epitaxial pattern 450. Further, the second device isolating film 360 may be in contact with the lower interlayer insulating film 190.

In the semiconductor device according to some example embodiments, the second device isolating film 360 may include the same material as the first lower interlayer insulating film 161 of the first device isolating film 160. For example, the second device isolating film 360 may include a silicon nitride.

A depth from the upper surface of the third fin-type pattern 310 to the lowermost portion of the second device isolating film 360 is greater than a depth from the upper surface of the third fin-type pattern 310 to the lower surface of the third epitaxial pattern 350 and a depth from the upper surface of the third fin-type pattern 310 to the lower surface of the fourth epitaxial pattern 450.

Figure 24:
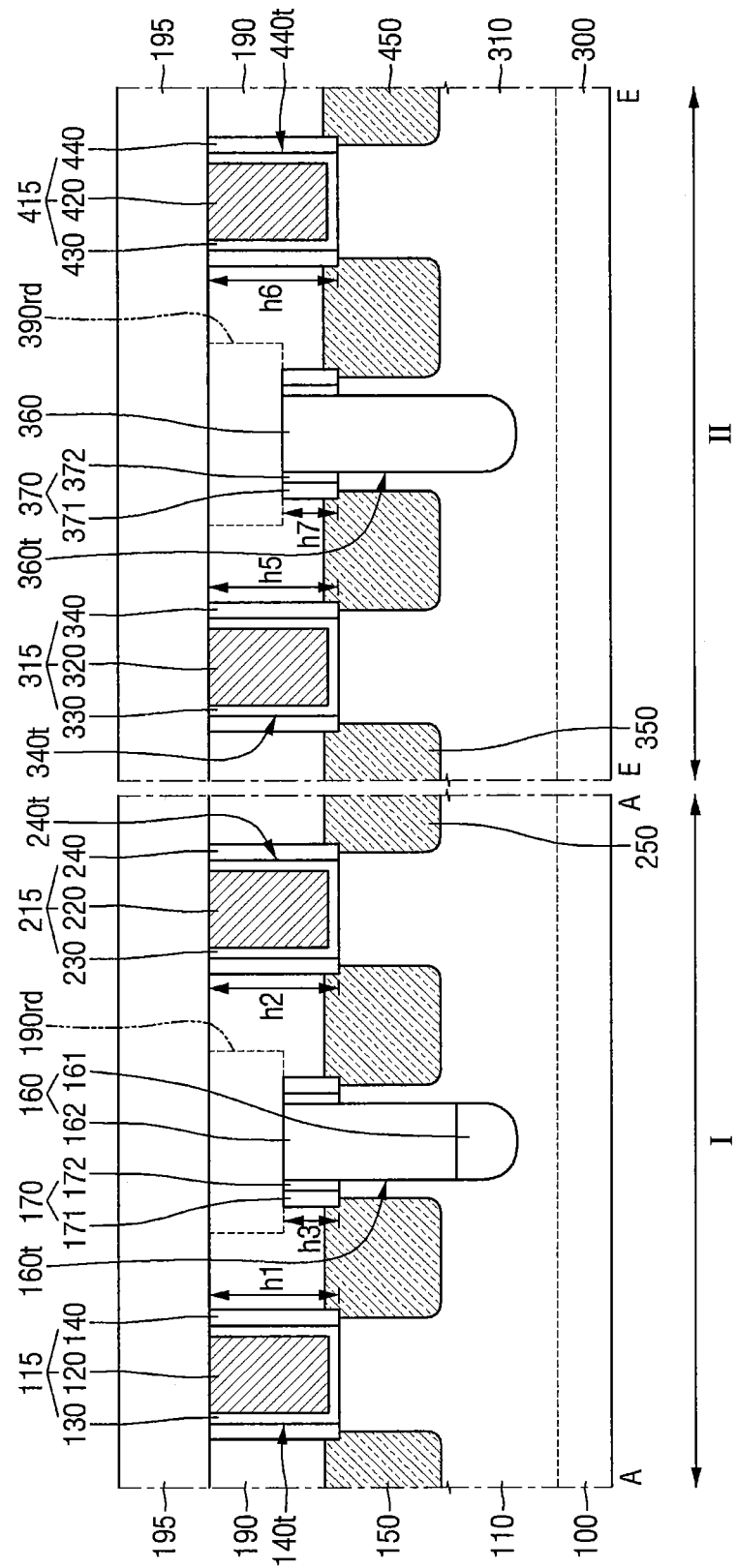
FIG. 24 is a view provided to explain a semiconductor device according to some example embodiments.

FIG. 24 is a view provided to explain a semiconductor device according to some example embodiments. For convenience of explanation, differences that are not explained above with reference to FIGS. 22 and 23 will be mainly explained below. Further, it is apparent that although the first region I in FIG. 24 illustrated similarly to FIG. 13, it may be one of various embodiments explained with reference to FIGS. 13 to 21.

Referring to FIG. 24, in the semiconductor device according to some example embodiments, the first upper insulating film 162 may cover the uppermost surface of the first lower insulating film 161. Further, the uppermost surface of the first lower insulating film 161 may not be in contact with the lower interlayer insulating film 190.

FIGS. 25 to 32 are views illustrating intermediate stages of fabrication, provided to explain a method for fabricating a semiconductor device according to some example embodiments.

Figure 25:
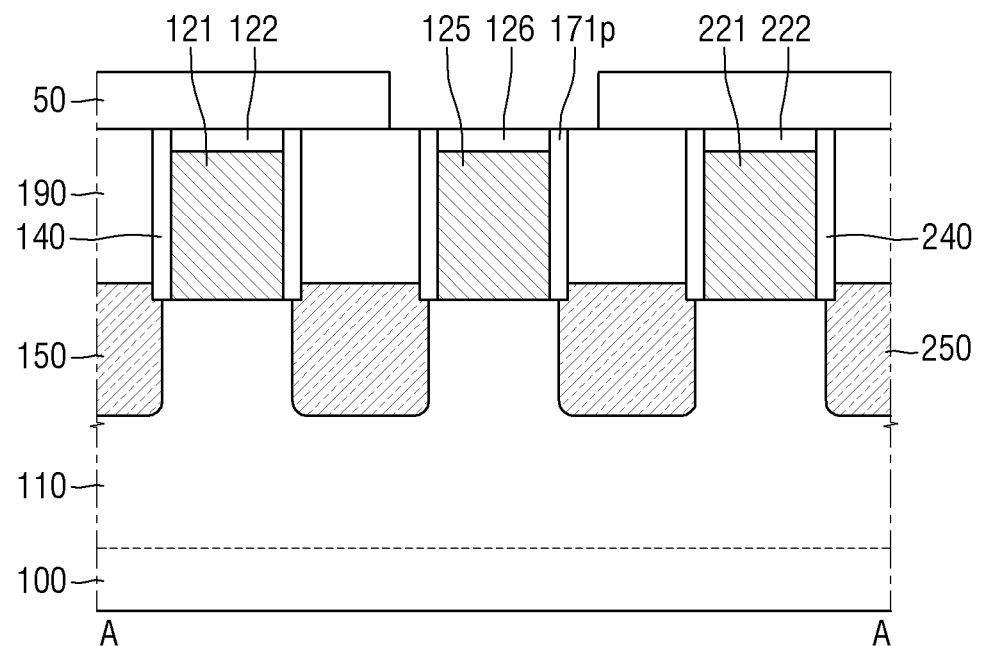
FIGS. 25 to 32 are views illustrating intermediate stages of fabrication, provided to explain a method for fabricating a semiconductor device according to some example embodiments.

Referring to FIG. 25, a first fin-type pattern 110 protruding from the substrate 100 is formed on the substrate 100. On the first fin-type pattern 110, first to third dummy gate electrodes 121, 125, 221 and first to third hard masks 122, 222, 126 are formed, intersecting the first fin-type pattern 110 and being spaced apart from each other. The first to third hard masks 122, 222, 126 may include a nitride film.

Further, a first gate spacer 140 is formed on a sidewall of the first dummy gate electrode 121, a second gate spacer 240 is formed on a sidewall of the second dummy gate electrode 221, and a pre-spacer 171p is formed on a sidewall of the third dummy gate electrode 125.

A first epitaxial pattern 150 is formed between the first dummy gate electrode 121 and the third dummy gate electrode 125, and a second epitaxial pattern 250 is formed between the second dummy gate electrode 221 and the third dummy gate electrode 125. A lower interlayer insulating film 190 is formed to cover the first epitaxial pattern 150 and the second epitaxial pattern 250. The lower interlayer insulating film 190 may expose the first hard mask 122 on the first dummy gate electrode 121, the second hard mask 222 on the second dummy gate electrode 221, and the third hard mask 126 on the third dummy gate electrode 125.

A mask pattern 50 exposing the third hard mask 126 is formed on the lower interlayer insulating film 190.

Figure 26:
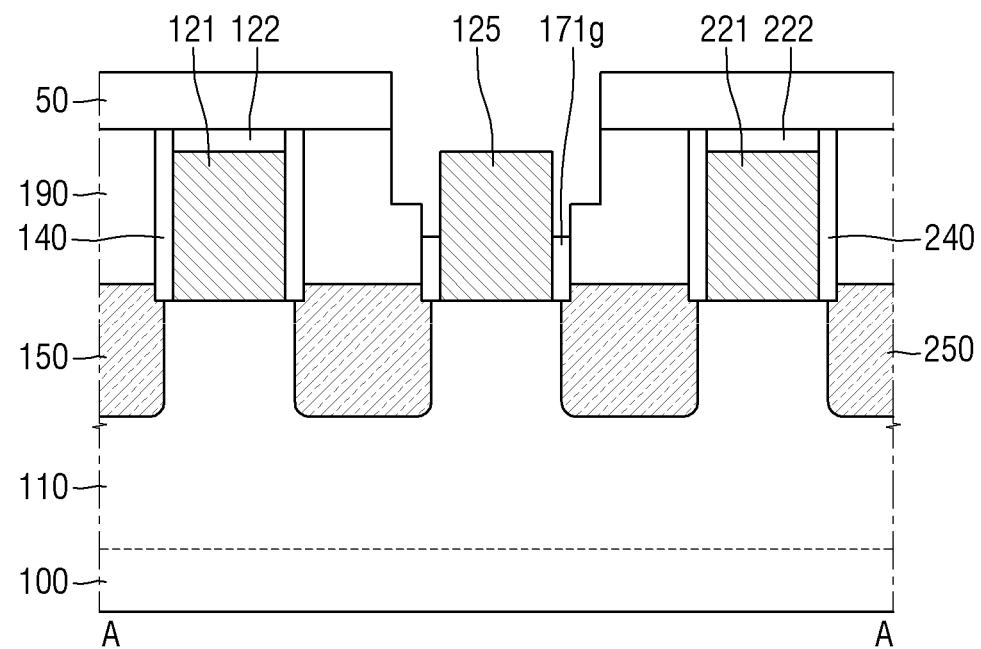

Referring to FIG. 26, the exposed third hard mask 126 is removed by an etch process. When the third hard mask 126 and the pre-spacer 171p include a same material, a portion of the pre-spacer 171p may be removed while the third hard mask 126 is removed. As a result, the etched pre-spacer 171g is formed on the sidewall of the third dummy gate electrode 125. Further, as illustrated, a portion of the lower interlayer insulating film 190 having an exposed upper surface may also be removed.

Figure 27:
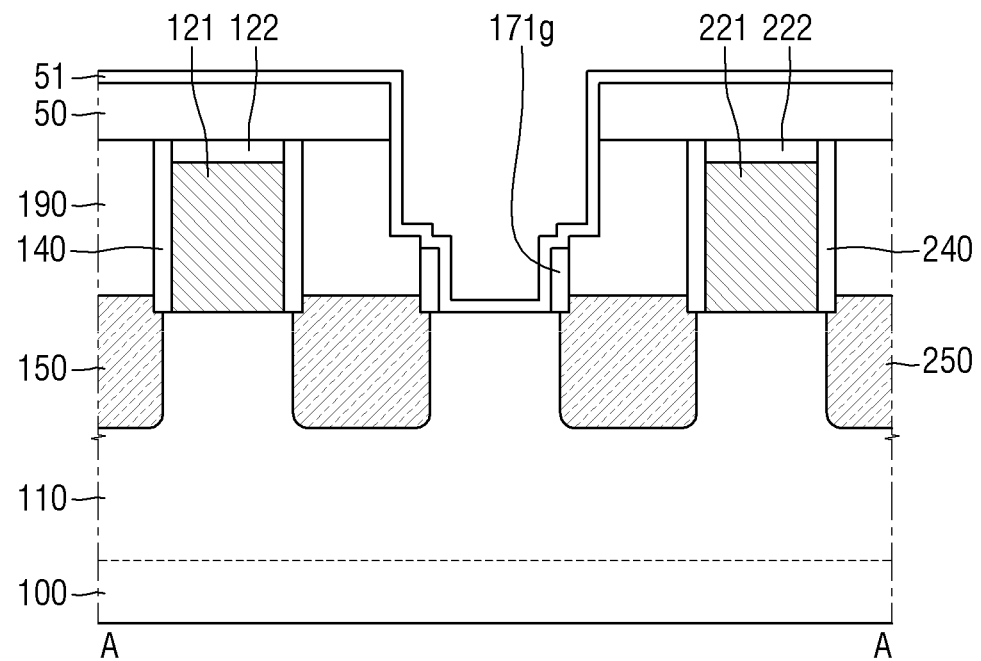

Referring to FIG. 27, the exposed third dummy gate electrode 125 is removed to expose the upper surface of the first fin-type pattern 110. An oxide film 51 is then formed along the upper surface of the mask pattern 50, a sidewall of the etched pre-spacer 171g, and the upper surface of the exposed first fin-type pattern 110.

Figure 28:
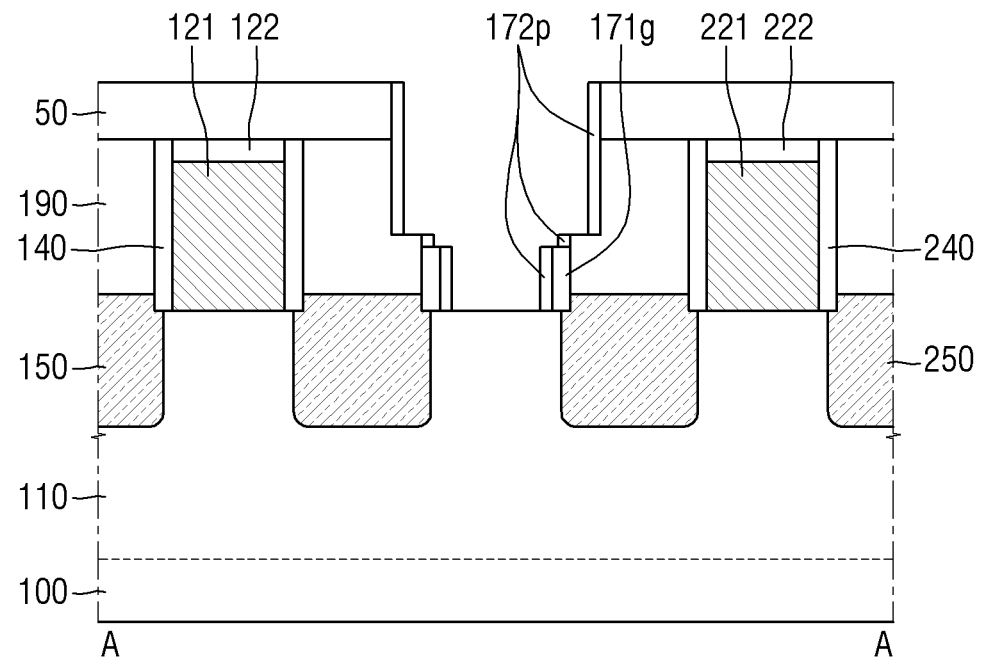

Referring to FIG. 28, with anisotropic etching of the oxide film 51, an oxide film pattern 172p is formed on a sidewall of the etched pre-spacer 171g and the exposed lower interlayer insulating film 190.

Figure 29:
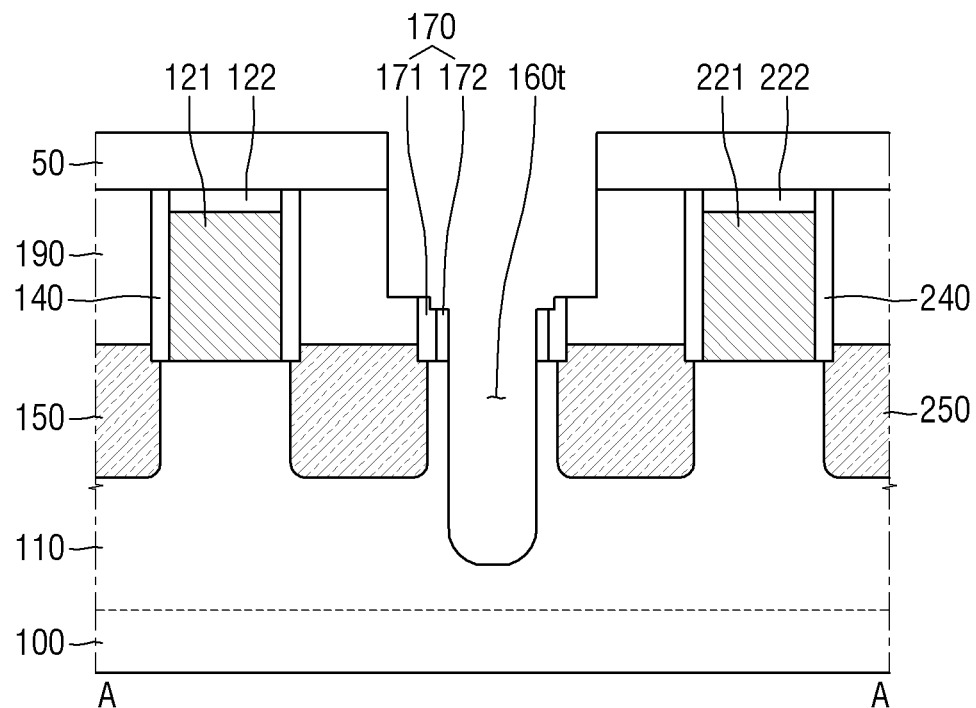

Referring to FIG. 29, the first fin-type pattern 110, the oxide film pattern 172p, and the etched pre-spacer 171g are etched using an etchant that may etch semiconductor material, oxide film, and nitride film with a predetermined selectivity. As a result, the first isolating trench 160t is formed in the first fin-type pattern 110. Further, a first inner spacer 172 and a first outer spacer 171 defining a portion of a sidewall of the first isolating trench 160t are formed. In this process, the mask pattern 50 may also be removed.

Figure 30:
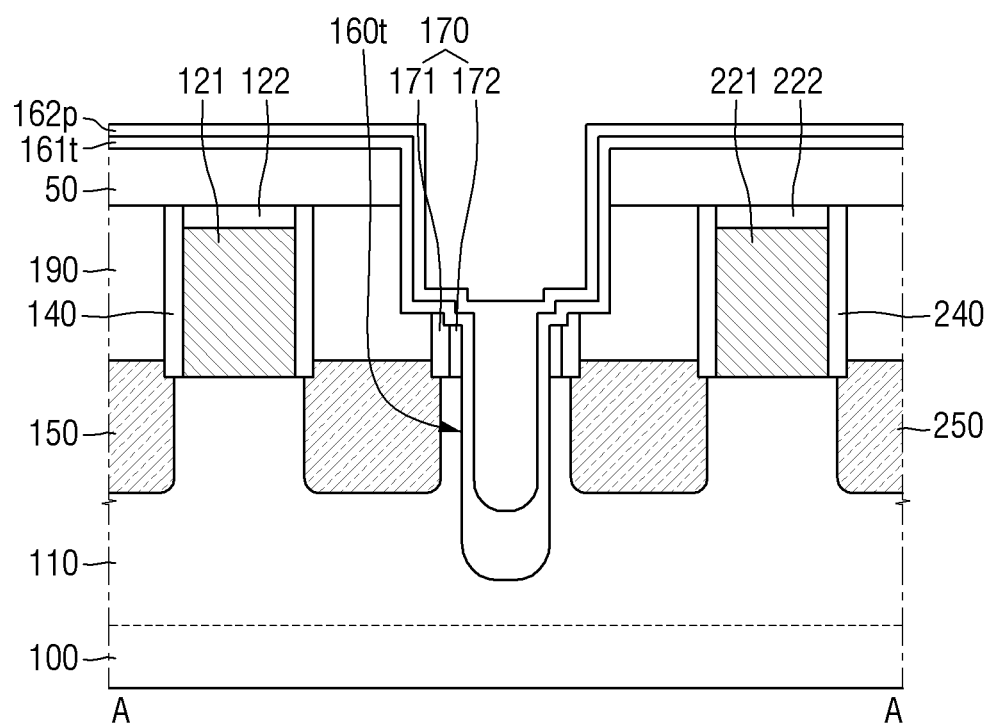

Referring to FIG. 30, a pre-lower insulating film 161t is formed along a sidewall and a bottom surface of the first isolating trench 160t, an upper surface of the lower interlayer insulating film 190, a first hard mask 122, and a second hard mask 222. At this time, a thickness of the pre-lower insulating film 161t formed on the bottom surface of the first isolating trench 160t is greater than a thickness of the lower insulating film 161t formed on the sidewall of the first isolating trench 160t. Then, a pre-upper insulating film 162p filling the first isolating trench 160t on the pre-lower insulating film 161t is formed.

Figure 31:
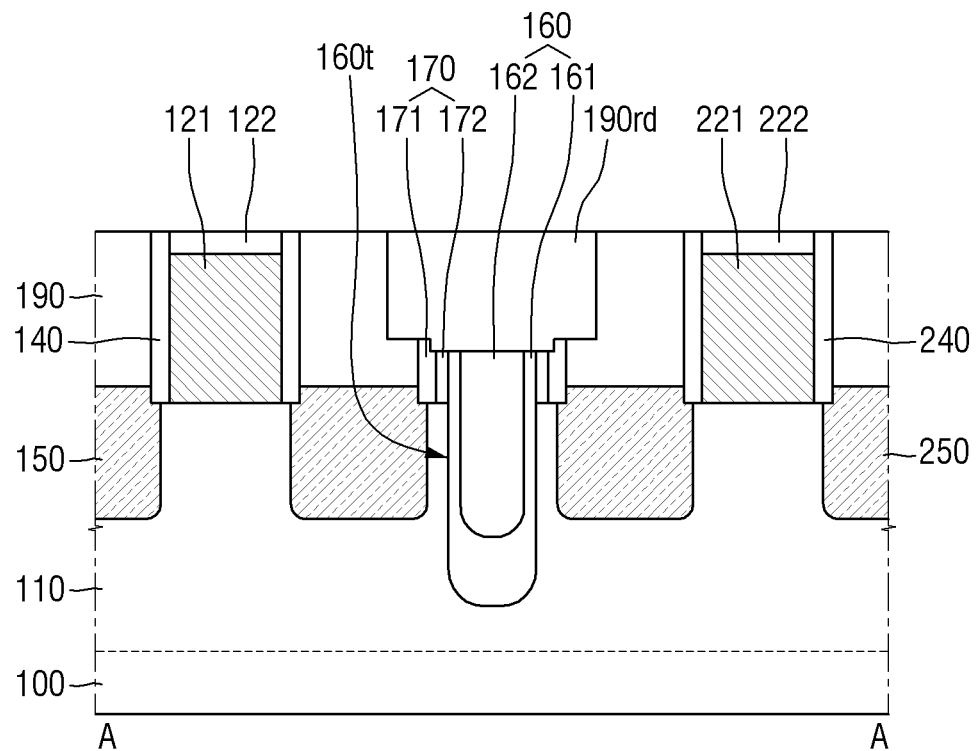

Referring to FIG. 31, the first device isolating film 160, including the first lower insulating film 161 and the first upper insulating film 162 in the first isolating trench 160t, is formed by partially removing the pre-lower insulating film 161t and the pre-upper insulating film 162p. Then, a redeposited insulating film 190rd is formed on the first device isolating film 160.

Figure 32:
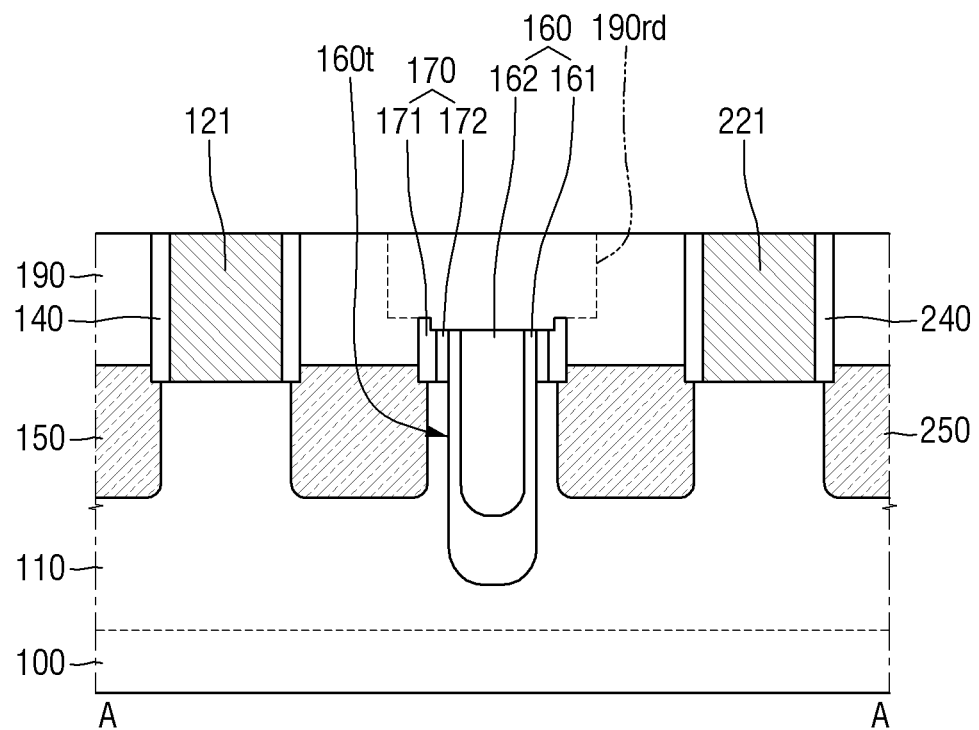

Referring to FIG. 32, the first and second dummy gate electrodes 121 and 221 are exposed by removing the lower interlayer insulating film 190, the first hard mask 122, and the second hard mask 222.

As illustrated, for example, in FIG. 2, first and second gate electrodes 120, 220 are then formed.

FIGS. 33 to 36 are views illustrating intermediate stages of fabrication, provided to explain a method for fabricating a semiconductor device according to some example embodiments. Redundant descriptions with respect to those described above with reference to FIG. 25 may be omitted.

Figure 33:
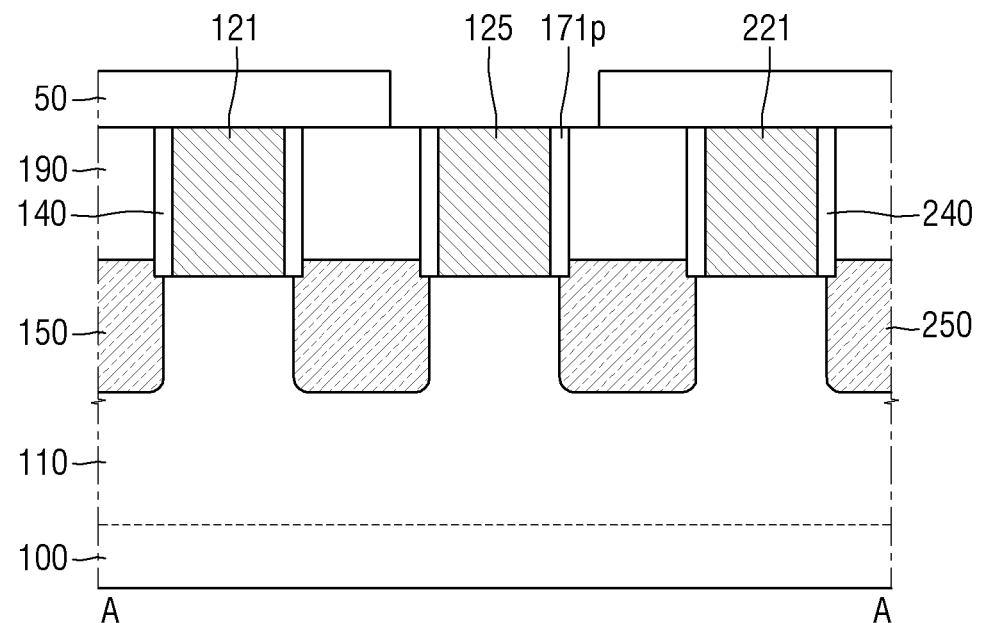
FIGS. 33 to 36 are views illustrating intermediate stages of fabrication, provided to explain a method for fabricating a semiconductor device according to some example embodiments.

Referring to FIG. 33, the lower interlayer insulating film 190 by which upper surfaces of the first to third dummy gate electrodes 121, 125, 221 are exposed is formed. On the lower interlayer insulating film 190, the mask pattern 50 is formed, covering the first and second gate electrodes 121, 221 and exposing the third dummy gate electrode 125.

Figure 34:
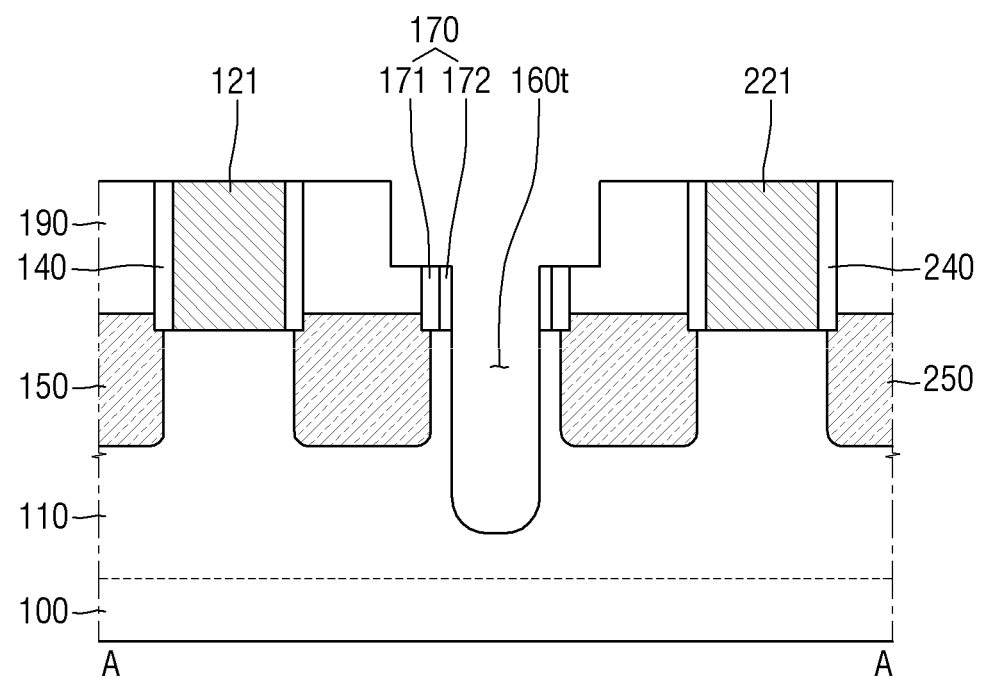

Referring to FIG. 34, a portion of the upper surface of the first fin-type pattern 110 is exposed by removing the third dummy gate electrode 125. An oxide film pattern (See FIG. 28) is formed on the sidewall of the pre-spacer 171p. Then, a portion of the pre-spacer 171p, a portion of the oxide film pattern, a portion of the first fin-type pattern 110, and a portion of the exposed lower interlayer insulating film 190 are etched. As a result, the first isolating trench 160t is formed in the first fin-type pattern 110. Further, a first dummy spacer 170 including a first inner spacer 172 and a first outer spacer 171 is formed. In this process, the mask pattern 50 may also be removed.

Figure 35:
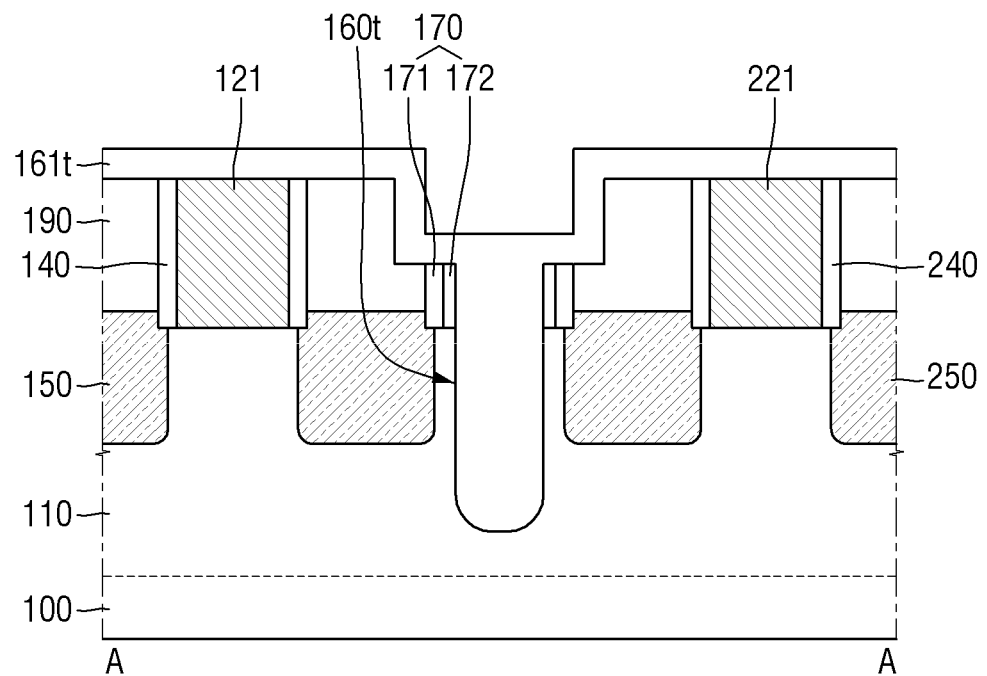

Referring to FIG. 35, the pre-lower insulating film 161t filling the first isolating trench 160t is formed. The pre-lower insulating film 161t is also formed on the upper surface of the lower interlayer insulating film 190.

Figure 36:
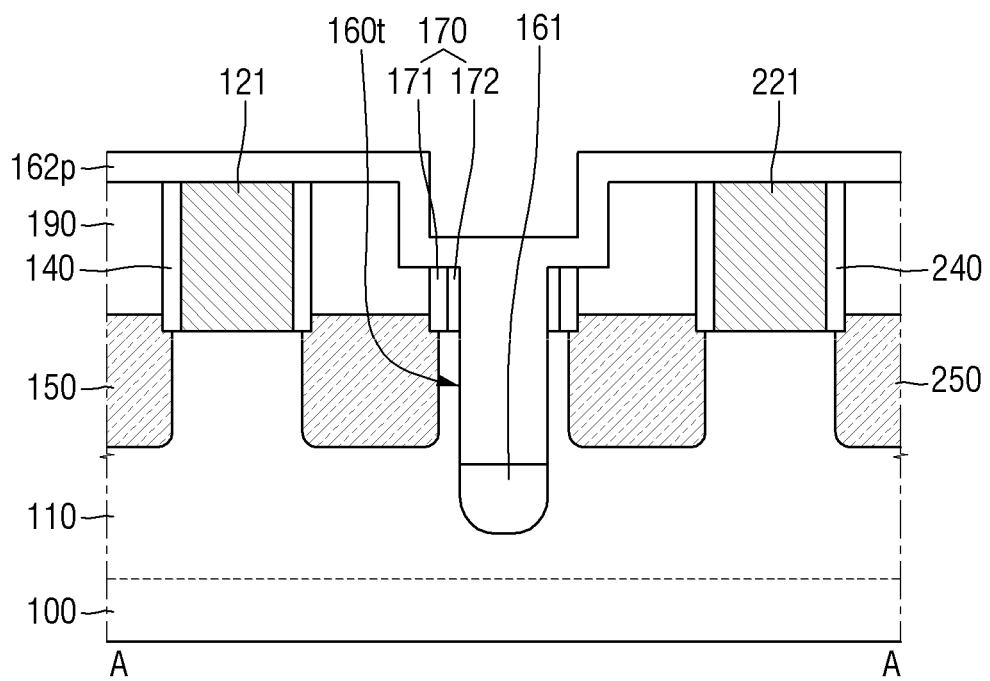

Referring to FIG. 36, the first lower insulating film 161 filling a portion of the first isolating trench 160t is formed by partially etching the pre-lower insulating film 161t. Then, a pre-upper insulating film 162p is formed, covering the uppermost surface of the first lower insulating film 161 and filling the rest of the first isolating trench 160t.

Then, the first device isolating film 160 (see, e.g., FIG. 13) including the first lower insulating film 161 and the first upper insulating film 162 in the first isolating trench 160t is formed by partially etching the pre-upper insulating film 162p.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device, comprising:
a fin-type pattern on a substrate;
a first gate structure on the fin-type pattern, the first gate structure including a first gate spacer;
a second gate structure on the fin-type pattern, the second gate structure being spaced apart from the first gate structure and including a second gate spacer;
a pair of dummy spacers spaced apart from each other between the first gate spacer and the second gate spacer, wherein a height from an upper surface of the fin-type pattern to an upper surface of the pair of dummy spacers is less than a height from the upper surface of the fin-type pattern to an upper surface of the first and second gate spacers;
a trench between the pair of dummy spacers, the trench including a sidewall defined by the fin-type pattern and one of the pair of dummy spacers;
a device isolating film in the trench, and including a first insulating film and a second insulating film on the first insulating film, the first insulating film extending along the sidewall and a bottom surface of the trench, and a thickness of the first insulating film on the bottom surface of the trench being greater than a thickness of the first insulating film on the sidewall of the trench; and
an interlayer insulating film on a sidewall of the first gate structure, on a sidewall of the second gate structure, and on the device isolating film,
wherein an uppermost surface of the first insulating film and an uppermost surface of the second insulating film are in contact with the interlayer insulating film.

2. The semiconductor device of claim 1, wherein the second insulating film is between sidewalls of the first insulating film.

3. The semiconductor device of claim 1, wherein each of the pair of dummy spacers includes an outer spacer and an inner spacer between the outer spacer and the device isolating film.

4. The semiconductor device of claim 3,
wherein the outer spacer includes a lower portion and an upper portion on the lower portion, and
wherein a width of the lower portion of the outer spacer is greater than that of the upper portion of the outer spacer.

5. The semiconductor device of claim 3, wherein the outer spacer comprises a same material as the first gate spacer and the second gate spacer.

6. The semiconductor device of claim 1, wherein each of the pair of dummy spacers includes a first portion with a width that decreases continuously with increasing distance from the upper surface of the fin-type pattern.

7. The semiconductor device of claim 6,
wherein each of the pair of dummy spacers includes a second portion between the first portion and the fin-type pattern, and wherein a width of the second portion is constant over different distances of the second portion from the upper surface of the fin-type pattern.

8. The semiconductor device of claim 1, further comprising:
a first epitaxial pattern between the first gate spacer and the pair of dummy spacers; and
a second epitaxial pattern between the second gate spacer and the pair of dummy spacers,
wherein a depth from the upper surface of the fin-type pattern to a lower surface of each of the first and second epitaxial patterns is less than a depth from the upper surface of the fin-type pattern to a lowermost portion of the device isolating film.

9. The semiconductor device of claim 8, wherein the depth from the upper surface of the fin-type pattern to the lower surface of each of the first and, second epitaxial patterns is less than a depth from the upper surface of the fin-type pattern to a lowermost portion of the second insulating film.

10. The semiconductor device of claim 8, wherein the depth from the upper surface of the fin-type pattern to the lower surface of each of the first and second epitaxial patterns is greater than a depth from the upper surface of the fin-type pattern to a lowermost portion of the second insulating film.

11. The semiconductor device of claim 1, wherein a Young's modulus of the first insulating film is greater than that of the second insulating film.

12. The semiconductor device of claim 11,
wherein the first insulating film comprises a silicon nitride, and
wherein the second insulating film comprises one of silicon oxide, silicon carbide (SiC), silicon oxycarbide (SiOC), silicon oxynitride (SiON), or silicon oxycarbon nitride (SiOCN).

13. A semiconductor device, comprising:
a substrate including a first region and a second region;
a first fin-type pattern in the first region;
a first gate structure including a first gate spacer, on the first fin-type pattern;
a second gate structure spaced apart from the first gate structure and including a second gate spacer, on the first fin-type pattern;
a pair of first dummy spacers spaced apart from each other between the first gate spacer and the second gate spacer;
a first trench between the pair of first dummy spacers, including a sidewall defined by the first fin-type pattern and the pair of first dummy spacers;
a first device isolating film in the first trench, and including a first insulating film, and a second insulating film on the first insulating film, the first insulating film having a different material from the second insulating film;
a second fin-type pattern in the second region;
a third gate structure including a third gate spacer, on the second fin-type pattern;
a fourth gate structure spaced apart from the third gate structure and including a fourth gate spacer, on the second fin-type pattern;
a pair of second dummy spacers spaced apart from each other between the third gate spacer and the fourth gate spacer;
a second trench between the pair of second dummy spacers, including a sidewall defined by the second fin-type pattern and the pair of second dummy spacers; and
a second device isolating film in the second trench, and including a same material as the first insulating film.

14. The semiconductor device of claim 13, wherein:
a height from the substrate to an upper surface of the pair of first dummy spacers is less than a height from the substrate to an upper surface of the first and second gate spacers;
a height from the substrate to an upper surface of the pair of second dummy spacers is less than a height from the substrate to an upper surface of the third and fourth gate spacers;
the first region comprises a first conductivity type transistor;
the second region comprises a second conductivity type transistor; and
the second conductivity type is different from the first conductivity type.

* * * * *